(12) United States Patent
Kuribara et al.

(10) Patent No.: US 10,347,353 B2
(45) Date of Patent: Jul. 9, 2019

(54) MEMORY SYSTEM

(71) Applicant: TOSHIBA MEMORY CORPORATION, Minato-ku (JP)

(72) Inventors: Makoto Kuribara, Yokohama (JP); Katsuhiko Ueki, Katsushika (JP); Yoshihisa Kojima, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/633,358

(22) Filed: Jun. 26, 2017

(65) Prior Publication Data

US 2017/0301402 A1 Oct. 19, 2017

Related U.S. Application Data

(62) Division of application No. 14/850,577, filed on Sep. 10, 2015, now Pat. No. 9,711,240.

(Continued)

(51) Int. Cl.
*G11C 29/02* (2006.01)
*G11C 16/26* (2006.01)
*G11C 29/42* (2006.01)
*G11C 16/34* (2006.01)
*G06F 11/10* (2006.01)

(52) U.S. Cl.
CPC ........ *G11C 29/028* (2013.01); *G06F 11/1048* (2013.01); *G11C 16/26* (2013.01); *G11C 16/349* (2013.01); *G11C 29/021* (2013.01); *G11C 29/42* (2013.01)

(58) Field of Classification Search
CPC ........ G11C 29/028; G11C 16/26; G11C 29/42
See application file for complete search history.

(56) References Cited

U.S. PATENT DOCUMENTS 7,590,919 B2 * 9/2009 Kanno ................ G06F 11/1072
714/763
8,086,933 B2 * 12/2011 Yamaga .............. G06F 11/1012
714/755

(Continued)

FOREIGN PATENT DOCUMENTS

JP 4575288 11/2010
JP 2011-203878 10/2011

(Continued)

*Primary Examiner* — Joseph D Torres
(74) *Attorney, Agent, or Firm* — Oblon, McClelland, Maier & Neustadt, L.L.P.

(57) ABSTRACT

According to one embodiment, a memory system includes a semiconductor memory and a memory controller. The memory controller writes a first data group in the semiconductor memory and then reads the first data group from the semiconductor memory. The memory controller counts a number of first data and a number of second data based on a comparison of a second data group with a third data group. The memory controller changes a first charge threshold based on the number of first data and the number of second data. The second data group is the first data group at the time of writing to the semiconductor memory. The third data group is the first data group read from the semiconductor memory. The first data is data changed from a first code to a second code. The second data is data changed from the second code to the first code.

10 Claims, 17 Drawing Sheets

Related U.S. Application Data

(60) Provisional application No. 62/101,276, filed on Jan. 8, 2015.

(56) References Cited

U.S. PATENT DOCUMENTS

| | | | | |
|---|---|---|---|---|
| 8,381,066 B2* | 2/2013 | Yamaga | ............... | G06F 11/1012 714/755 |
| 8,418,042 B2* | 4/2013 | Kanno | ................ | G06F 11/1068 714/784 |
| 8,473,813 B2* | 6/2013 | Gonzalez | ............... | G11C 16/26 365/189.07 |
| 8,499,216 B2 | 7/2013 | Yamaga | | |
| 8,566,682 B2 | 10/2013 | Gower et al. | | |
| 8,599,613 B2 | 12/2013 | Abiko et al. | | |
| 8,625,347 B2 | 1/2014 | Sakurada | | |
| 8,751,896 B2 | 6/2014 | Yamaga | | |
| 8,751,911 B2 | 6/2014 | Kanno | | |
| 8,862,944 B2 | 10/2014 | Dodson et al. | | |
| 9,048,878 B2 | 6/2015 | Kanno | | |
| 2005/0122767 A1* | 6/2005 | Perner | .................... | G11C 11/16 365/158 |
| 2006/0245239 A1* | 11/2006 | Sumita | ................ | G06F 9/30141 365/154 |
| 2007/0033492 A1* | 2/2007 | Weber | ................. | G06F 11/1068 714/766 |
| 2008/0282106 A1* | 11/2008 | Shalvi | ................ | G06F 11/1068 714/6.12 |
| 2009/0282308 A1* | 11/2009 | Gutsche | ............. | G06F 11/1048 714/746 |
| 2012/0226962 A1* | 9/2012 | Franceschini | ........ | G11C 16/349 714/766 |
| 2012/0303871 A1 | 11/2012 | Tokiwa | | |
| 2013/0080857 A1* | 3/2013 | Lee | .................... | G06F 11/1068 714/773 |
| 2016/0203873 A1* | 7/2016 | Kuribara | ................ | G11C 16/26 365/185.24 |
| 2017/0092371 A1* | 3/2017 | Harari | ................ | G11C 16/3431 |
| 2017/0221567 A1* | 8/2017 | Yamauchi | ........... | G06F 11/1068 |

FOREIGN PATENT DOCUMENTS

| | | |
|---|---|---|
| JP | 2012-248244 | 12/2012 |
| JP | 5166074 | 3/2013 |
| JP | 2013-080450 | 5/2013 |
| JP | 5259765 | 8/2013 |
| JP | 2013-539086 | 10/2013 |

* cited by examiner

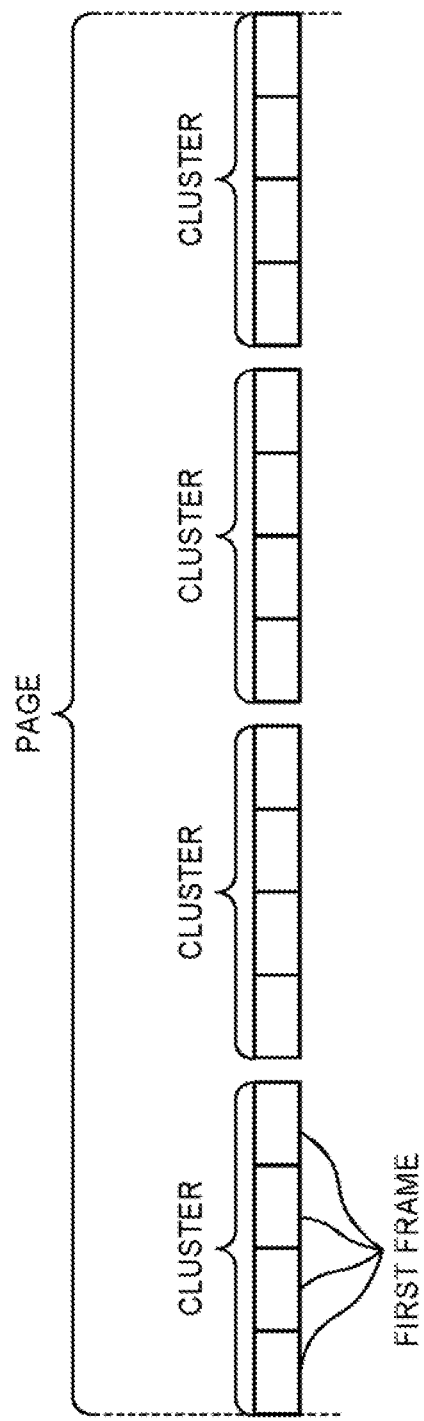

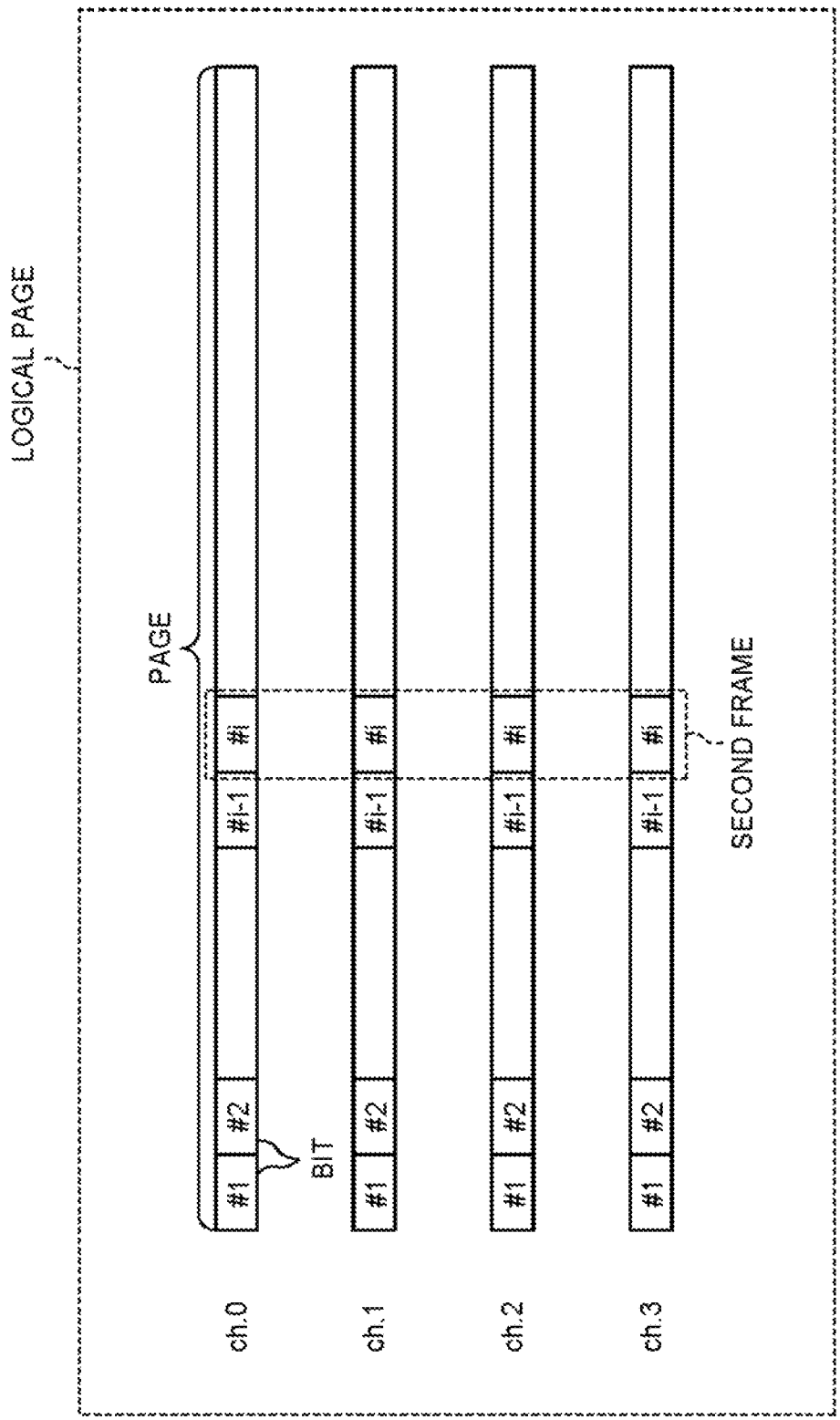

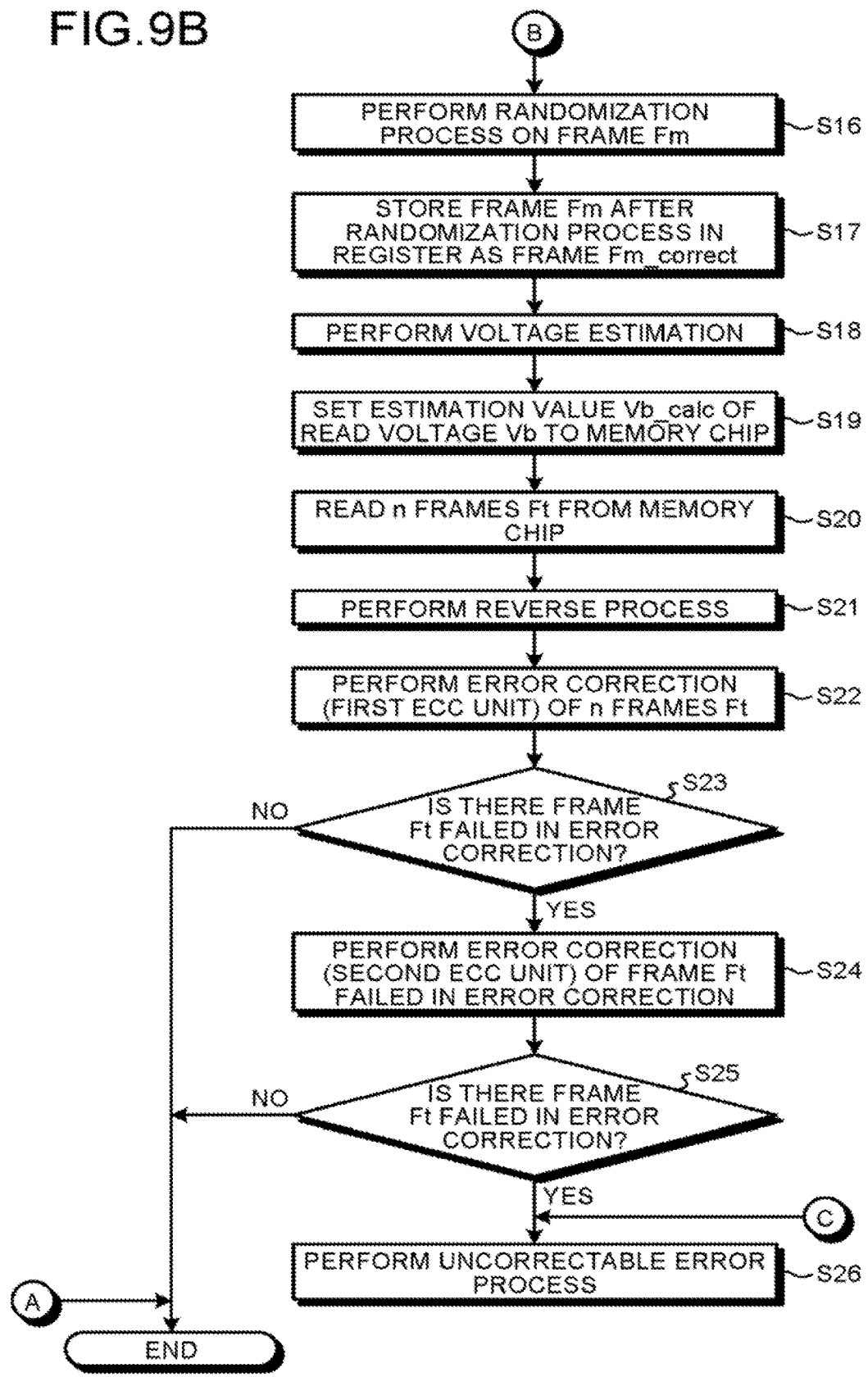

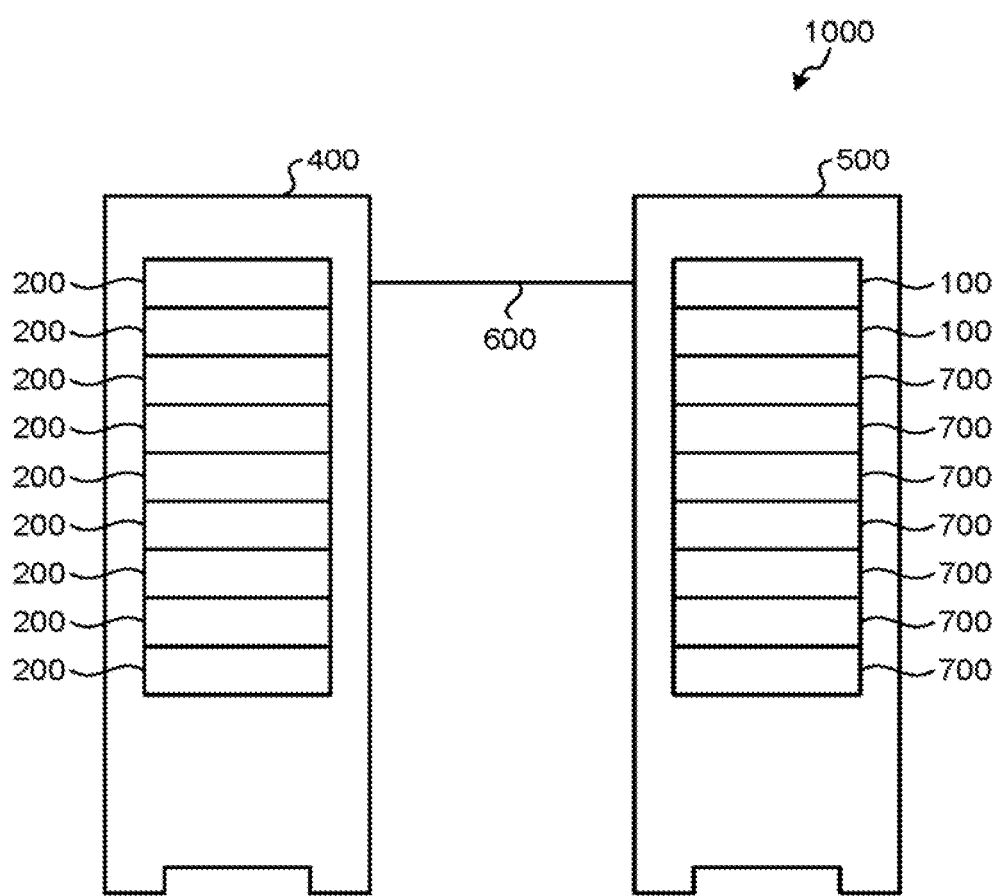

MEMORY SYSTEM

CROSS-REFERENCE TO RELATED APPLICATIONS

This application is a divisional of U.S. application Ser. No. 14/850,577, filed Sep. 10, 2015, which is based upon and claims the benefit of priority from U.S. Provisional Application No. 62/101,276, filed on Jan. 8, 2015; the entire contents of each of which are incorporated herein by reference.

FIELD

Embodiments described herein relate generally to a memory system.

BACKGROUND

Conventionally, a semiconductor memory has been widely known which includes a memory cell holding charges corresponding to data. The data to be stored in the memory cell is determined based on a comparison of a voltage corresponding to the amount of charges held in the memory cell with a predetermined read voltage. The amount of charges held in the memory cell is changed with time and at each access time. In order to prevent that the data is changed according to the change in the amount of charges, there is developed a technology in which the read voltage is shifted according to the change in the amount of charges.

BRIEF DESCRIPTION OF THE DRAWINGS

FIG. 7 is a diagram illustrating a configuration example of a page;

FIG. 8 is a diagram illustrating a configuration example of a second frame;

FIG. 9B is a flowchart for describing an operation of the memory system at the time of "read" of the lower page;

FIG. 17 is a diagram illustrating an example of mounting the memory system.

DETAILED DESCRIPTION

In general according to one embodiment, a memory system includes a semiconductor memory and a memory controller. The semiconductor memory is configured to include a memory cell array and a peripheral circuit. The memory cell array includes memory cells which hold charges. The peripheral circuit compares an amount of charges with a first charge threshold to determine a code according to the amount of charges. The memory controller writes a first data group in the semiconductor memory and then reads the first data group from the semiconductor memory. The memory controller counts a number of first data and a number of second data based on a comparison of a second data group with a third data group. The memory controller changes the first charge threshold based on the number of first data and the number of second data. The second data group is the first data group at the time of writing to the semiconductor memory. The third data group is the first data group read from the semiconductor memory. The first data is data changed from a first code to a second code. The second data is data changed from the second code to the first code.

Embodiments of the memory system will be described with reference to the accompanying drawings. Further, the invention is not limited to these embodiments.

First Embodiment

Figure 1:
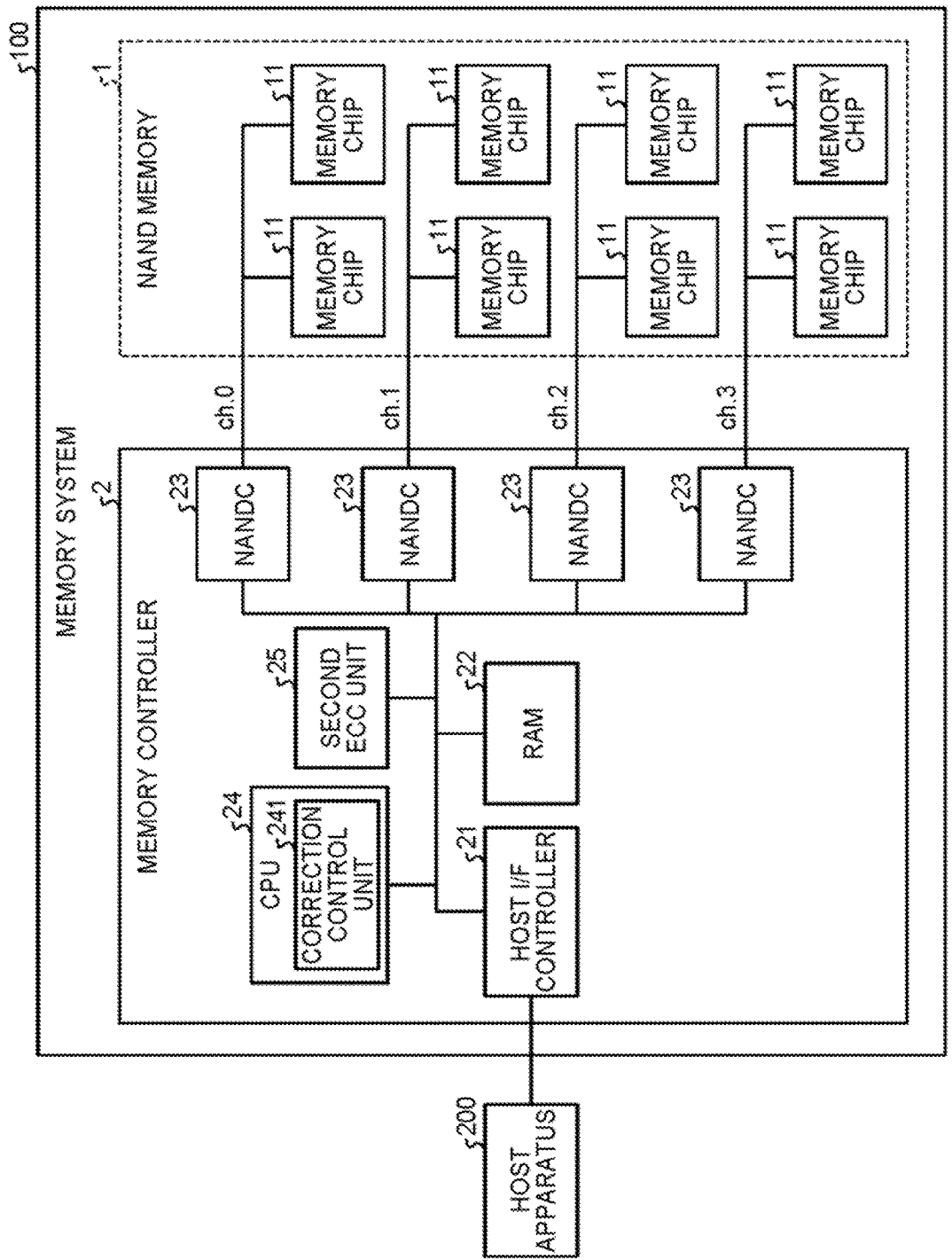
FIG. 1 is a diagram illustrating a configuration example of a memory system of a first embodiment.

FIG. 1 is a diagram illustrating a configuration example of a memory system of a first embodiment. A memory system 100 is connected to a host apparatus 200 through a communication interface in conformity to Advanced Technology Attachment (ATA) standard. Serial Attached SCSI (SAS) standard, a Peripheral Components Interconnect (PCI) Express standard, and the like. The host apparatus 200, for example, corresponds to a server, a personal computer, a mobile information processing apparatus, or the like. The memory system 100 serves as an external storage apparatus of the host apparatus 200.

The memory system 100 includes a NAND flash memory (NAND memory) 1 and a memory controller 2 which performs data transfer between the host apparatus 200 and the NAND memory 1. Further, the memory system 100 may be provided with any other type of memory instead of the NAND memory 1. For example, the memory system 100 may be provided with a NOR flash memory instead of the NAND memory 1.

The NAND memory 1 includes a plurality (herein, "8") of memory chips 11 as the semiconductor memory. In addition, the memory controller 2 includes four channels (ch. 0 to ch. 3). Each channel is connected to two memory chips 11. Each channel is configured to include a control signal line, an I/O signal line, a Chip Enable (CE) signal line, and an RY/BY signal line. The I/O signal line is a signal line for transferring data, an address, and various instructions. The memory controller 2 can transmit a read instruction, a program instruction, and an erase instruction to the memory chip 11 through the I/O signal line. A Write Enable (WE) signal line, a Read Enable (RE) signal line, a Command Latch Enable (CLE) signal line, an Address Latch Enable (ALE) signal line, a Write Protect (WP) signal line, and the like are collectively referred to as the control signal line. By using signal line groups of the respective channels disposed independently of each other, the memory controller 2 can control two memory chips 11 connected one channel independently of the memory chip 11 connected to another channel. Since two memory chips 11 connected to the same channel share the signal line group, the chips are accessed respectively at different timing from the memory controller 2.

Figure 2:
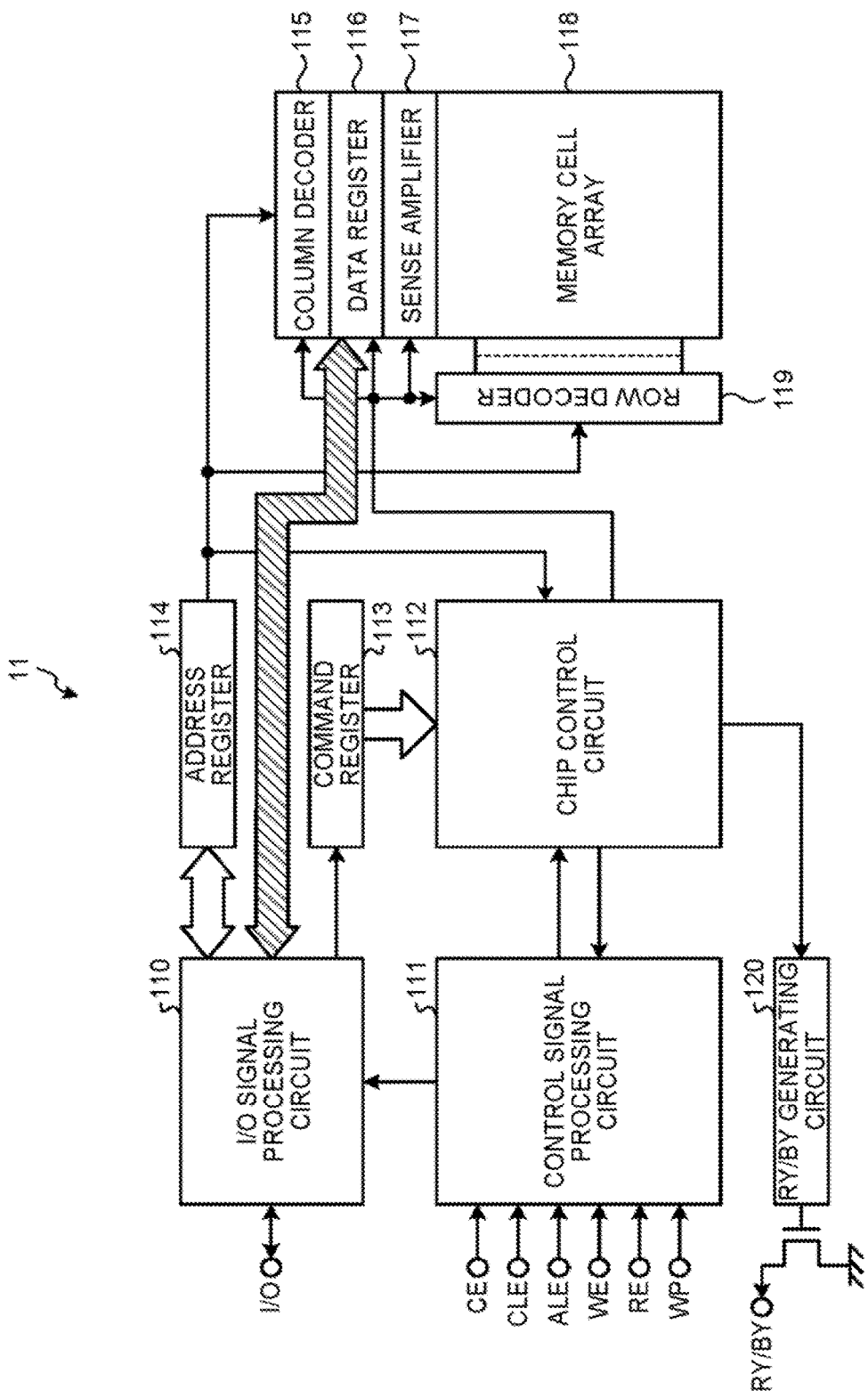
FIG. 2 is a diagram for describing a configuration example of each memory chip.

FIG. 2 is a diagram for describing a configuration example of each memory chip 11. The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generating circuit 120.

The chip control circuit 112 is a state transition circuit which transitions states based on various types of control signals received through the control signal processing circuit 111. The chip control circuit 112 controls the entire operation of the memory chip 11. The RY/BY generating circuit 120 transitions the state of the RY/BY signal line between a ready state (RY) and a busy state (BY) under control of the chip control circuit 112.

The I/O signal processing circuit 110 is a buffer circuit which transmits and receives an I/O signal with respect to the memory controller 2. A command latched by the I/O signal processing circuit 110, an address to indicate an access destination, data are separately stored in the address register 114, the command register 113, and the data register 116, respectively.

The address stored in the address register 114 includes a chip address, a row address, and a column address in an order from the upper level. The chip address is identification information for distinguishing the respective memory chips 11. The chip address is read by the chip control circuit 112, the row address is read by the row decoder 119, and the column address is read by the column decoder 115, respectively.

The control signal processing circuit 111 receives an input of the control signal. The control signal processing circuit 111 switches registers of a storage destination of the I/O signal received by the I/O signal processing circuit 110 based on the received control signal. In addition, the control signal processing circuit 111 transfers the received control signal to the chip control circuit 112.

The memory cell array 118 is configured to include a plurality of blocks. Each block is a unit of erasure.

Figure 3:
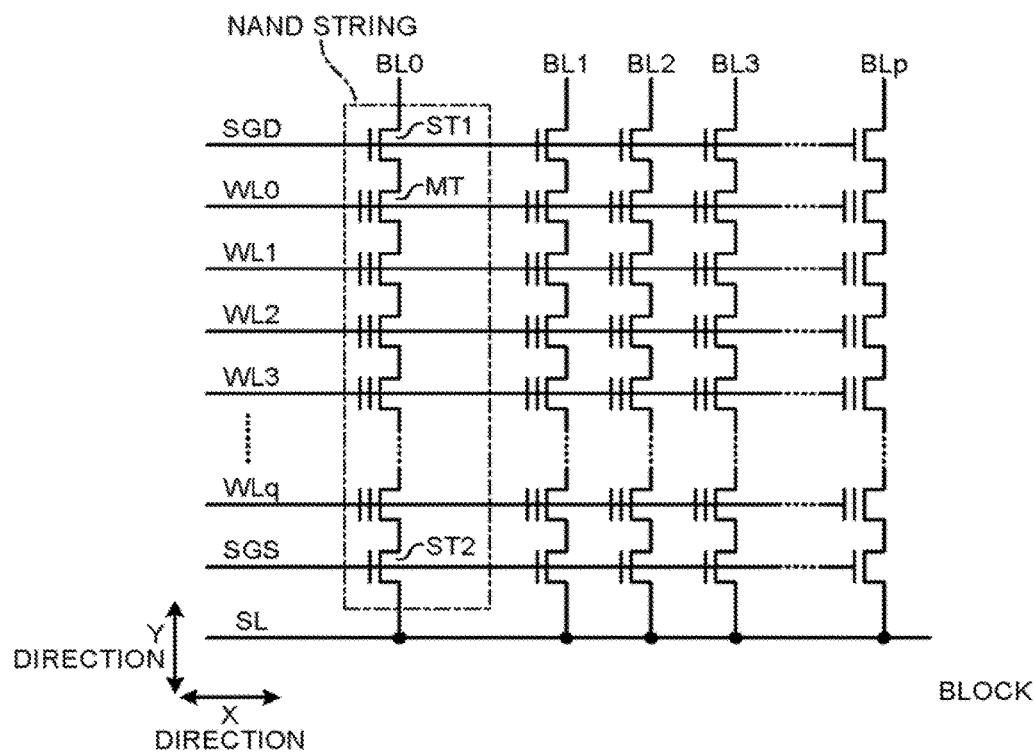
FIG. 3 is a circuit diagram illustrating a configuration example of one block included in a memory cell array.

FIG. 3 is a circuit diagram illustrating a configuration example of one block included in the memory cell array 118. As illustrated in the drawing, each block includes (m+1) NAND strings which are sequentially disposed along an X direction (m≥0). A select transistor ST1 contained in each of (m+1) NAND strings is configured to include a drain connected to each of bit lines BL0 to BLp, and a gate commonly connected to a select gate line SGD. In addition, a select transistor ST2 is configured to include a source commonly connected to a source line SL, and a gate commonly connected to the select gate line SGS.

Each memory cell transistor MT is configured by a metal oxide semiconductor field effect transistor (MOSFET) which includes a stacked gate structure formed on a semiconductor substrate. The stacked gate structure includes a floating gate formed on the semiconductor substrate with a tunnel oxide film interposed therebetween and a control gate electrode formed on the floating gate with an inter-gate insulating film interposed therebetween. A threshold voltage is changed according to the number of electrons accumulated in the floating gate. The memory cell transistor MT stores data according to a difference of the threshold voltage. In other words, the memory cell transistor MT holds charges as many as the data in the floating gate.

In each NAND string, the (n+1) memory cell transistors MT are disposed such that the current paths thereof are connected in series between the source of the select transistor ST1 and the drain of the select transistor ST2. Then, the control gate electrode is connected to each of word lines WL0 to WLq sequentially from the memory cell transistor MT located on a side closest the drain. Therefore, the drain of the memory cell transistor MT connected to the word line WL0 is connected to the source of the select transistor ST1, and the source of the memory cell transistor MT connected to the word line WLq is connected to the drain of the select transistor ST2.

The word lines WL0 to WLq are connected to the control gate electrode of the memory cell transistor MT in common between the NAND strings in the block. In other words, the control gate electrodes of the memory cell transistors MT disposed on the same row in the block are connected to the same word line WL. In a case where each memory cell transistor MT is configured to foe capable of holding a 1-bit value, the (m+1) memory cell transistors MT connected to the same word line WL are handled as one page, and programming of the data and reading of the data are performed for the each page.

Each memory cell transistor MT may be configured to be capable of holding a plurality of bit values. For example, in a case where each memory cell transistor MT is configured to store n-bit values (n≥2), a storage capacity per word line becomes equal in size of n pages. Herein, as an example, a memory system (hereinafter, referred to as a 2-bit storing method) in which each memory cell transistor MT stores a 2-bit value will be described. According to the 2-bit storing method, 2-page data is held in each word line. In two pages configured by one word line, a page to be written previously is denoted by a lower page, and a page to be written after the lower page is denoted by an upper page. In addition, the memory cell transistor MT is simply denoted by a memory cell.

Figure 4:
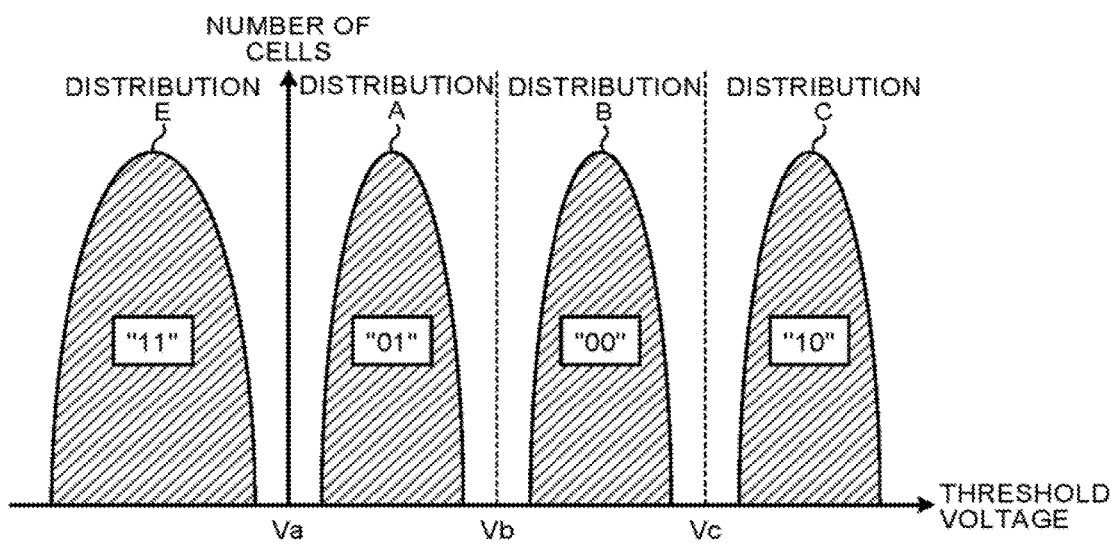
FIG. 4 is a diagram illustrating a distribution of a threshold voltage of a memory cell group in a case where a 2-bit storing method is employed.

FIG. 4 is a diagram illustrating a distribution of a threshold voltage of a memory cell group in a case where the 2-bit storing method is employed. In this drawing, the horizontal axis indicates the threshold voltage, and the vertical axis indicates the number of memory cells. According to the 2-bit storing method, each memory cell can hold 4-value data "xy" defined as the data "x" belonging to the upper page and the data "y" belonging to the lower page. The values of the data "x" and the data "y" are set to a code "0" or a code "1". The threshold voltage of each memory cell is controlled to belong to any of four groups Distribution E, Distribution A, Distribution B, and Distribution C. The correspondence between the respective distributions and the 4-value data "xy" is set. in advance. For example, a code "11" is assigned to Distribution E. A code "01" is assigned to Distribution A. A code "00" is assigned to Distribution B. A code "10" is assigned to Distribution C. Further, the correspondence between the respective distributions and the 4-value data "xy" is not limited to the above configuration. Any system can be employed as long as each data is assigned to each distribution so that a humming distance between the neighboring distributions becomes "1".

The row decoder 119, the column decoder 115, the data register 116, and the sense amplifier 117 constitute the peripheral circuit. The peripheral circuit performs access (reading, programming, and erasing) to the memory cell array 118 based on the control of the chip control circuit 112.

For example, at the time of programming, the row decoder 119 selects the word line corresponding to the read row address, and activates the selected word line. The column decoder 115 selects a bit line corresponding to the read column address and activates the bit line. The sense amplifier 117 programs the data stored in the data register 116 into a memory cell located at an intersection between the word line selected by the row decoder 119 and a bit line selected by the column decoder 115 by applying a voltage to the bit line selected by the column decoder 115. Specifically, "programming" means that the sense amplifier 117 applies a high-voltage programming pulse to the control gate electrode of each memory cell through the word line WL until the threshold voltage reaches a target value corresponding to the code.

At the time of reading, the sense amplifier 117 precharges the bit line BL to a power source potential Vcc, and the row decoder 119 sequentially applies a plurality of threshold voltages (hereinafter, referred to as a read voltage) for specifying a distribution of each code ("11", "01", "00", or "10") to the selected word line WL. Further, the row decoder 119 applies a transfer voltage to an un-selected word line WL, and sets a memory cell belonging to the tins elected word line WL to be a conductive state. The sense amplifier 117 detects which the read voltage applied when the precharged charges are flowed out to the source line SL. The sense amplifier 117 determines the data stored in a target memory cell based on the detected read voltage.

For example, as illustrated in FIG. 4, a read voltage Va is set between Distribution E and Distribution A, a read voltage Vb is set between Distribution A and Distribution B, a read voltage Vc is set between Distribution B and Distribution C.

In a case where a read target is the lower page, the read voltage Vb is used in determination. When the outflow of the charges to the source line SL is detected in a case where the read voltage Vb is applied, the sense amplifier 117 determines that the code "1" is stored in the target memory cell. In addition, when the outflow of the charges to the source line SL is not detected in a case where the read voltage Vb is applied, the sense amplifier 117 determines that the code "0" is stored in the target memory cell.

In a case where the read target is the upper page, the read voltage Va and the read voltage Vc are used in determination. When the outflow of the charges is detected in a case where the read voltage Va is applied, or when the outflow of the charges is not determined even in a case where any one of the read voltage Va and the read voltage Vc is applied, the sense amplifier 117 determines that the code "1" is stored in the target memory cell. When the outflow of the charges is not detected in a case where the read voltage Va is applied and the outflow of the charges is detected in a case where the read voltage Vc is applied, the sense amplifier 117 determines that the code "0" is stored in the target memory cell.

At the time of erase, an erase voltage is applied to the substrate of the memory cell array 118 by a potential generating circuit (not illustrated). Then, the row decoder 119 operates to electrically connect all the word lines WL of an erase target block to the ground potential. Then, the charges accumulated in the floating gate are discharged from each memory cell in the selected block. As a result, the state of each memory cell in the selected block transitions to an erase state (that is, a state where the code "11" is stored).

The sense amplifier 117 stores the read data in the data register 116. The data stored in the data register 116 is sent to the I/O signal processing circuit 110 through a data line, and transferred from the I/O signal processing circuit 110 to the memory controller 2.

Figure 5:
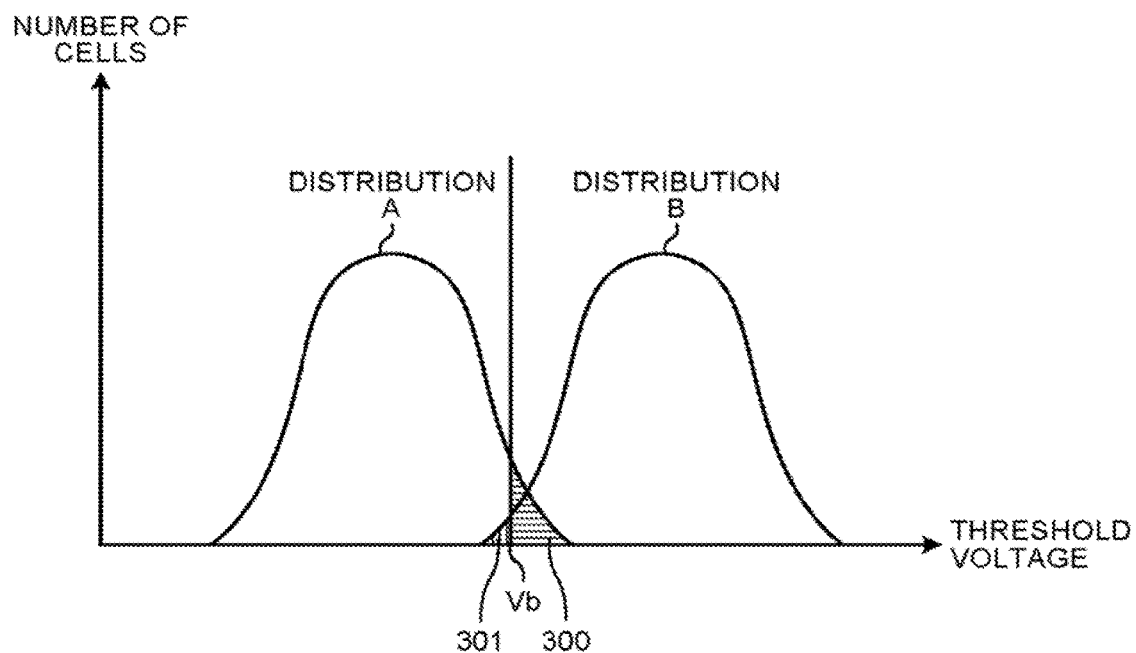
FIG. 5 is a diagram for describing an example of respective distributions after being changed.

Each distribution is changed with time or at each access. FIG. 5 is a diagram for describing an example of distributions after being changed. In this diagram, only Distribution A and Distribution B are illustrated for the sake of simplicity. The skirt of Distribution A and the skirt of Distribution B are overlapped. A maximum value of Distribution A exceeds the read voltage Vb, and a minimum value of Distribution B is lower than the read voltage Vb. In a case where a memory cell (that is, a memory cell included in area 300) which belongs to Distribution A and of which the threshold voltage is larger than Vb is read, it is recognized that the memory cell belongs to Distribution B. In other words, the code programmed as "01" is read as "00". In a case where a memory cell (that is, a memory cell contained in area 301) which belongs to Distribution B and of which the threshold voltage is smaller than Vb is read, it is recognized that the memory cell belongs to Distribution A. In other words, the code programmed as "00" is read as "01". The data of which the code is changed after the programming is detected as an error at the time of read in the memory controller 2. In the memory controller 2, the detected error is attempted to be corrected by ECC units (a first ECC unit 231 and a second ECC unit 25) to be described.

There is a limitation on the number of errors which are correctable by the respective ECC units. The memory controller 2 can shift each read voltage to make the number of bits to be detected as an error (hereinafter, referred to as an error number) as small as possible. A process of estimating each read voltage to make the error number as small as possible is denoted by a voltage estimation process. The memory controller 2 sets each read voltage thus estimated to the memory chip 11. The memory chip 11 performs a read operation on the memory cell array 118 using each read voltage set by the memory controller 2.

At the time when the voltage estimation process is performed, the memory controller 2 performs a read operation plural times on trial (hereinafter, referred to as a test reading) while changing each read voltage. The memory controller 2 individually calculates FBC(x1y1, x2y2) which represents a number changed from "x1y1" to "x2y2" and FBC(x2y2, x1y1) which represents a number changed from "x2y2" to "x1y1" in order to efficiently determine each read voltage (hereinafter, referred to as a test voltage) set on trial. Further, "y1", "x1", "y2", and "x2" each are the code "0" or the code "1". "x1" and "x2" are data belonging to the upper page, and "y1" and "y2" are data belonging to the lower page. "x1y1" and "x2y2" are codes assigned to two distributions neighboring each other. The distribution assigned by the code "x2y2" has a threshold voltage higher than that assigned by the code "x1y1". The memory controller 2 calculates an estimation value Vi_calc of the read voltage Vi (i is a, b, or c) between the distribution assigned by "x1y1" and the distribution assigned by "x2y2" based on FBC(x1y1, x2y2) and FBC(x2y2, x1y1). The voltage estimation process will be described below.

The memory controller 2 includes a host interface controller (a host I/F controller) 21, a Random Access Memory (RAM) 22, four BAND controllers 23, a CPU 24, and the second SCC unit 25. The host I/F controller 21, the RAM 22, each NAND controller 23, the CPU 24, and the second ECC unit 25 are connected to each other through a bus.

The RAM 22 serves as a buffer for data transfer between the host apparatus 200 and the NAND memory 1. In addition, the RAM 22 provides the CPU 24 with a work area. Any type of the RAM 22 is applicable. For example, a Dynamic Random Access Memory (DRAM) or a Static Random Access Memory (SRAM) is applicable.

The CPU 24 performs control, on the entire memory controller 2 based on firmware. In particular, the CPU 24 serves as a correction control unit 241 which controls a sequence for error correction. The firmware, for example, is stored in the NAND memory 1 in advance, and loaded from the NAND memory 1 to the work area in the RAM 22 by the CPU 24 at the time of starting the memory system 100. The CPU 24 executes the firmware loaded in the work area.

The host I/F controller 21 performs control of a communication interface between the host apparatus 200 and the memory system 100 and control of the data transfer between the host apparatus 200 and the RAM 22 under the control of the CPU 24.

Each of four NAND controllers 23 controls a channel different respectively. Each NAND controller 23 performs control on the data transfer between the NAND memory 1 and the RAM 22 under the control of the CPU 24.

Figure 6:
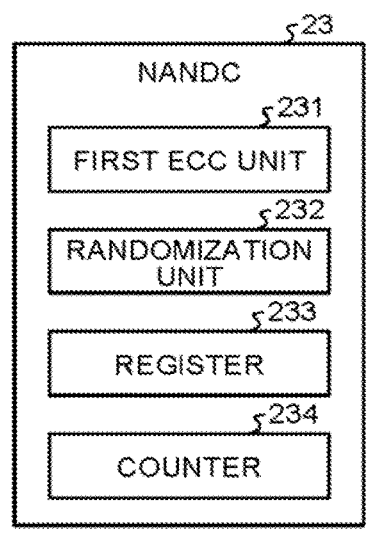
FIG. 6 is a diagram illustrating a configuration example of each NAND controller.

FIG. 6 is a diagram illustrating a configuration example of each NAND controller 23. Each NAND controller 23 includes the first ECC unit 231, a randomization unit 232, a register 233, and a counter 234.

The first ECC unit 231 performs encoding for the error correction on the data of program target or the error correction on the data read out of the NAND memory 1. The error correction is to correct an error contained in the data. Any type of encoding method of the first ECC unit 231 is applicable. The first ECC unit 231, for example, can use a BCH code. In a case where the error correction is failed, the first ECC unit 231 reports the result to the CPU 24.

FIG. 7 is a diagram illustrating a configuration example of a page. As illustrated in the drawing, 1-page data is configured by four clusters. The cluster is a minimum unit output from the memory chip 11 to the NAND controller 23. The size of the cluster is smaller than that of the page. For example, in the memory chip 11, the 1-page data is read out of the memory cell array 118 to the data register 116, and then a cluster designated by the column address in the 1-page data read out of the data register 116 is output to the memory controller 2. One cluster includes four first frames which are an encoding unit of the first ECC unit 231.

The randomization unit 232 performs a randomization process on the data encoded by the first ECC unit 231. The memory controller 2 can equalize the number of "0" and "1" included in the data of program target, and can uniformly disperse the writing locations of "0" and the writing locations of "1" by the randomization process. In addition, the randomization unit 232 performs a process (hereinafter, referred to as a reverse process) which is reversed in the randomization process on the data read out of the NAND memory 1. The error correction of the first ECC unit 231 is performed after the reverse process is performed.

Further, as the method of the randomization process, any method is applicable. For example, the randomization process is a process of performing an EXOR operation between the program target data and a random number generated in advance. The reverse process is a process of performing the EXOR operation between the data read out of the NAND memory 1 and the same random number as that at the time of programming.

In addition, the randomization unit 232 is used even in the voltage estimation process. The operation of the randomization unit 232 in the voltage estimation process will be described below.

The register 233 and the counter 234 are used in the voltage estimation process. Specifically, the first frame read out of the memory chip 11 is recovered. The recovered first frame is subjected to the randomization process by the randomization unit 232, and then stored in the register 233. The recovery is that the reverse process and the error correction of the first ECC unit 231 or the second ECC unit 25 are performed on the first frame read out of the memory chip 11. The counter 234 counts FBC(x1y1, x2y2) and FBC(x2y2, x1y1) by comparing the first frame stored in the register 233 with the first frame read by using the test voltage. The counter 234 reports FBC(x1y1, x2y2) and FBC(x2y2, x1y1) to the CPU 24.

The second ECC unit 25 performs encoding for the error correction on the data of program target, and performs the error correction on the data read out of the NAND memory 1. The frame of the error correction of the second ECC unit 25 (hereinafter, referred to as a second frame) is configured by a plurality of data belonging to a different page each other. As an encoding method of the second ECC unit 25, any method is applicable. The second ECC unit 25, for example, may use an RS code. The correction capability of the second ECC unit 25 is set to be higher than the correction capability of the first ECC unit 231.

FIG. 8 is a diagram illustrating a configuration example of the second frame. The memory controller 2 manages four pages to which access can be made simultaneously as one logical page (hereinafter, referred to as a logical page). According to the example, four pages which have different channels belonging to the memory chip 11 of a program destination form one logical page. 1-bit data is selected from each of four pages forming the logical page, and one second frame is formed by total selected 4-bit data. All the bits of each page form a certain one of a plurality of the second frames. For example, an i-th bit from the head of one page forms an i-th second frame together with i-th bits from the heads of other three pages forming the same logical page as the subject one page. In a case where a system for adding an error correction code to the data before the encoding is employed, the second ECC unit 25 calculates the error correction code in an incremental manner until all the data forming the logical page are determined. The second ECC unit 25 temporarily stores the error correction code in the RAM 22 during the calculation. After all the data forming the logical page are determined, the second ECC unit 25 determines the error correction code. The determined error correction code is programed at a predetermined location of the NAND memory 1.

Further, the description is made about the logical page configured to include four pages which have different channels belonging to the memory chip 11 of the program destination, but the invention is not limited to the configuration of the logical page.

For example, two memory chips 11 belonging to the same channel belongs to banks different from each other in Bank #0 and Bank #1, and the memory controller 2 may operate Bank #0 and Bank #1 according to a scheme called a bank interleave. The bank interleave is one of parallel operation schemes. Specifically, the bank interleave is a scheme for reducing a total processing time between the NAND memory 1 and the memory controller 2 by issuing a request for accessing another bank from the memory controller 2 in the middle of access of one or more memory chips 11 belonging to one bank toward the memory cell array 118. In a case where the bank interleave is performed, the logical page may be formed by eight pages having different belonging changes or belonging banks.

In addition, the memory cell array 118 may be configured by being divided into a plurality of Districts. Each District includes a plurality of blocks. Each District individually includes the row decoder 119, the column decoder 115, and the data register 116. The memory chip 11 can perform a simultaneously access to the plurality of Districts. In a case where the memory cell array 118 is configured by being divided into the plurality of Districts, the logical page may be configured by a plurality of pages different in the belonging channel, the belonging bank, or the belonging District.

The error correction code of the second ECC unit 25 may be written at a predetermined location of the same logical page as the second frame corrected by the error correction code. In addition, the description is made about the second frame which is configured by the respective pages forming the logical page, but the second frame may be configured by combination of the pages different from the logical page.

When the error correction is performed, the second ECC unit 25 acquires all the second frames which form each bank included in the first frame (hereinafter, referred to as a correction target frame) as a target of the error correction. Herein, in addition to the correction target frame, the second ECC unit 25 acquires the first frame of which the correction target frame is equal to the column address from among the other three pages belonging to the same logical page as the page containing the correction target frame. The second ECC unit 25 acquires a second error correction code for each acquired second frame. Then, the second ECC unit 25 corrects an error bit included in the correction target frame using the acquired second error correction code.

In addition, the second ECC unit 25 may repeatedly perform the error correction using a first error correction code and the error correction using the second error correction code on four acquired second frames to correct all the errors included in the four acquired second frames in plural times. The method of repeatedly performing the error correction using the first error correction code and the error correction using the second error correction code (hereinafter, referred to as a first method) has a correction ability higher than any of a method of the error correction only using the first error correction code and a system of the error correction only using the second error correction code (hereinafter, referred to as a second method). The second ECC unit 25 may perform any one of the error correction of the first method and the error correction of the second method. In addition, the second ECC unit 25 may first perform the error correction of the first method, and may perform the error correction of the second method in a case where the error correction of the first method is failed.

Figure 9A:
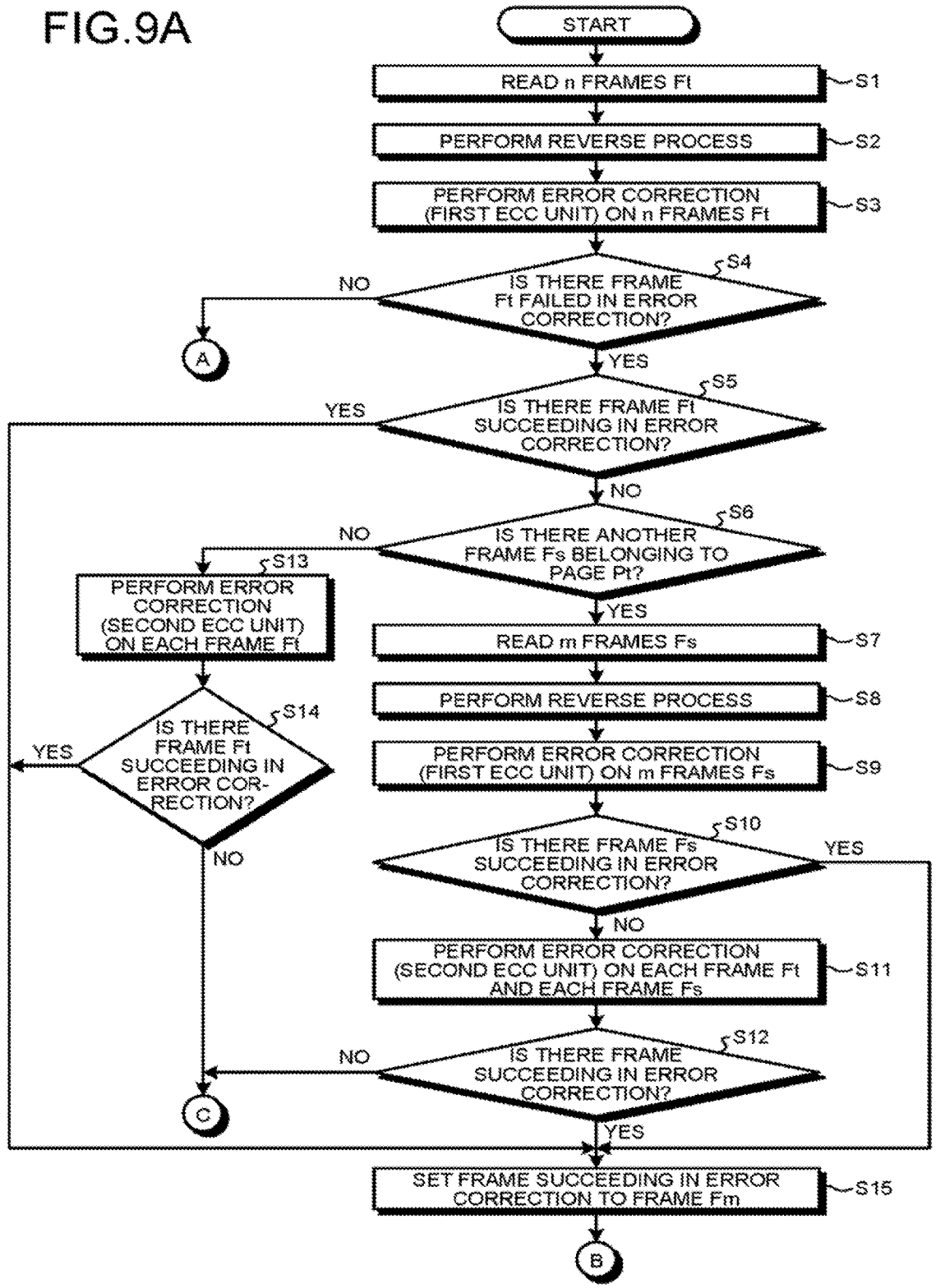
FIG. 9A is a flowchart for describing an operation of the memory system at the time of "read" of a lower page.

Next, the operation of the memory system 100 of the first embodiment will be described. FIGS. 9A and 9B are flowcharts for describing the operation of the memory system 100 when the lower page is read. Hereafter, it is assumed that a frame indicates the first frame.

First, the NAND controller 23 reads a frame Ft of the read target from the memory chip 11 (S1). Further, a frame forming data requested by the host apparatus 200 for being read, or a frame forming a page required for being read according to an inner process corresponds to the frame Ft of the read target. For example, compaction or wear leveling corresponds to the inner process. The number of frames Ft of the read target is n (n≥2), and it is assumed that n frames Ft belong to the same page Pt. Further, the number of frames Ft of the read target may be "1".

The randomization unit 232 performs the reverse process on the n read frames Ft (S2). The first ECC unit 231 performs the error correction on the n frames Ft subjected to the reverse process (S3). A result of the error correction is reported to the correction control unit 241.

The correction control unit 241 determines whether there is a frame Ft failed in the error correction (S4). In a case where there is no frame Ft failed in the error correction (No in S4), the n frames Ft are transmitted to the RAM 22 and the operation is terminated. The n frames Ft transmitted to the RAM 22 are transmitted to the host apparatus 200 under the control of the CPU 24.

In a case where there is a frame Ft failed in the error correction (Yes in S4), the correction control unit 241 shifts the read voltage Vb in the subsequent step. The correction control unit 241 performs the test reading plural times while changing a test voltage Vb_test in order to calculate a setting value of the read voltage Vb.

In the embodiment, the correction control unit 241 selects a target frame Fm of the test reading from the page to which the read target belongs. The reason why the correction control unit 241 searches the Target frame Fm of the test reading among the page where the read target belongs is that a plurality of frames belonging to the same page tends to be similarly changed in each distribution. Further, in a case where the read target and the threshold voltage tend to be similarly changed, the frame Fm may be selected from a page other than the page Pt. For example, the frame Fm may be selected from the block where the n frames Ft belong. The frame Fm may be selected from the frame Ft of the read target, or may be selected from a frame Fs which is not the read target. Herein, as an example, in a case where the frame Fm is not searched from the frame Ft of the read target, the frame Fm is selected from the frame Fs.

In a case where there is a frame Ft failed in the error correction (Yes in S4), the correction control unit 241 determines whether there is a frame Ft succeeding in the error correction (S5). In a case where there is no frame Ft succeeding in the error correction (No in S5), the correction control unit 241 determines whether there is a frame Fs which is not the read target among the plurality (herein, "16") of frames forming the page Pt (S6).

In a case where there is a frame Fs (Yes in S6), the correction control unit 241 reads the frame Fs from the memory chip 11 by controlling the NAND controller 23 (S7). Herein, the number of frames Fs is assumed to be m (m is an integer of one or more), and the m frames Fs are assumed to be read in the process of S7. Further, the number of frames Fs which is not the read target may be "1".

The randomization unit 232 performs the reverse process on the m read frames Fs (S8). The first ECC unit 231 performs the error correction on the in frames Fs subjected to the reverse process. The result of the error correction is reported to the correction control unit 241.

The correction control unit 241 determines whether there is the frame Fs succeeding in the error correction (S10). In a case where there is no frame Fs succeeding in the error correction (No in S10), the correction control unit 241 causes the second ECC unit 25 to sequentially perform the error correction of the n frames Ft and the m frames Fs until the error correction of at least one frame succeeds (S11). Then, the correction control unit 241 further determines whether there is a frame succeeding in the error correction (S12).

On the other hand, in a case where there is no frame Fs (No in S6), the correction control unit 241 causes the second ECC unit 25 to sequentially perform the error correction of the n frames Ft until a frame succeeding in the error correction is obtained (S13). Then, the correction control unit 241 determines whether there is the frame Ft succeeding in the error correction (S14).

In a case where there is the frame Ft succeeding in the error correction of the first ECC unit 231 (Yes in S5), a case where there is the frame Fs succeeding in the error correction of the first ECC unit 231 (Yes in S10), a case where there is a frame succeeding in the error correction of the second ECC unit 25 among the frames Ft and the frames Fs (Yes in S12), or in a case where there is the frame Ft succeeding in the error correction of the second ECC unit 25 (Yes in S14), the frame succeeding in the error correction is set to the frame Fm which is a target of the test reading (S15).

Subsequently to the process of S15, the randomization unit 232 performs the randomization process on the frame Fm (S16). The NAND controller 23 stores the frame Fm in the register 233 after the randomization process (S17). Herein, the frame Fm recovered and then subjected to the randomization process is denoted by the frame Fm_correct. The frame Fm_correct is the frame Fm recovered to a state at the time of being programed on the memory cell array 118.

Subsequently, the correction control unit 241 performs the voltage estimation process (S18).

Figure 10:
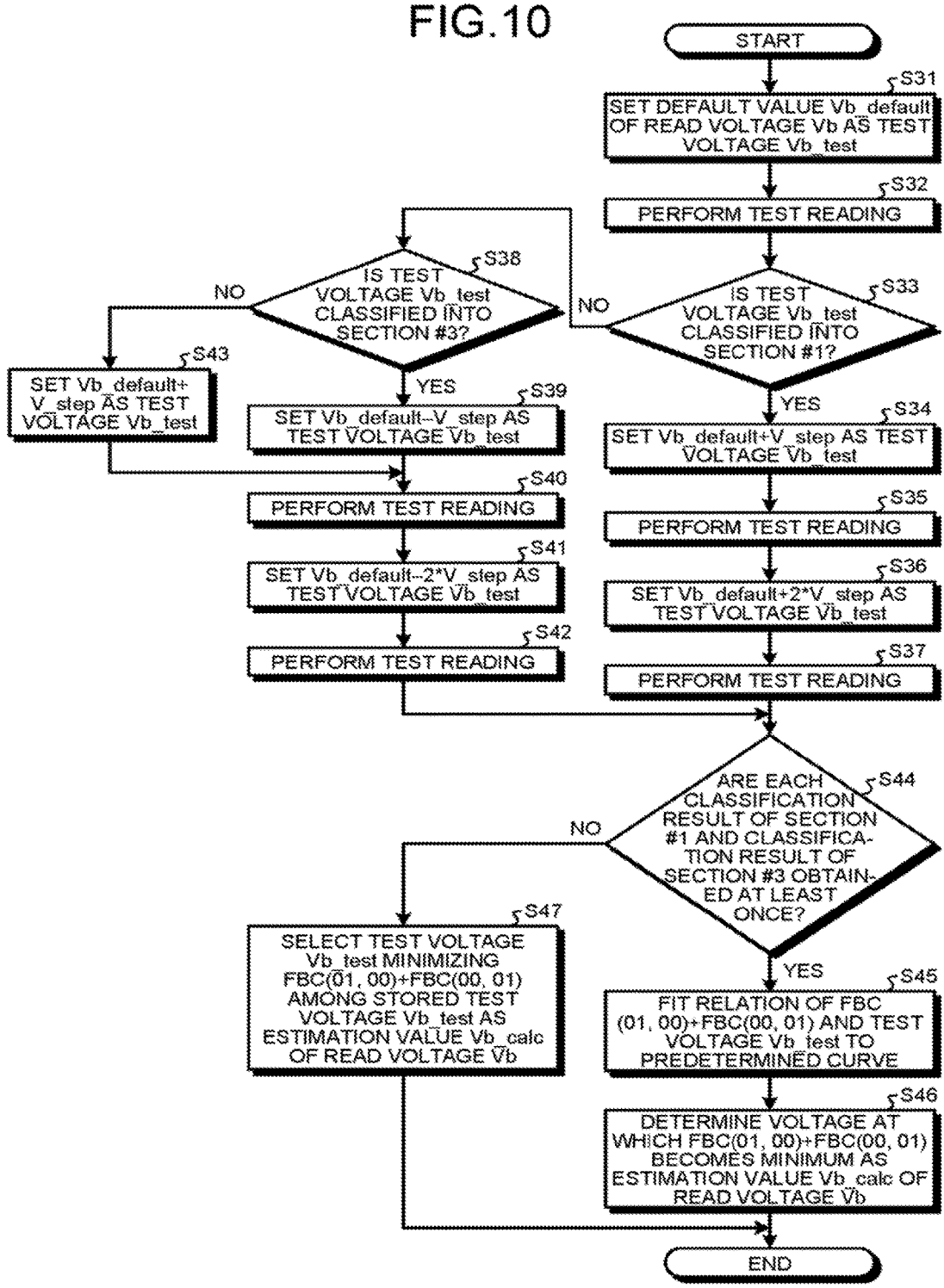
FIG. 10 is a flowchart for describing a voltage estimation process of the first embodiment.

FIG. 10 is a flowchart for describing the voltage estimation process of the first embodiment. First, the correction control unit 241 determines a default value Vb_default of the read voltage Vb to the test voltage Vb_test, and sets the test voltage Vb_test to the memory chip 11 (S31). The default value Vb_default may be stored by the correction control unit 241 in advance, or may be stored by the memory chip 11 in advance. After the test voltage Vb_test is set, the correction control unit 241 performs the test reading (S32).

Figure 11:
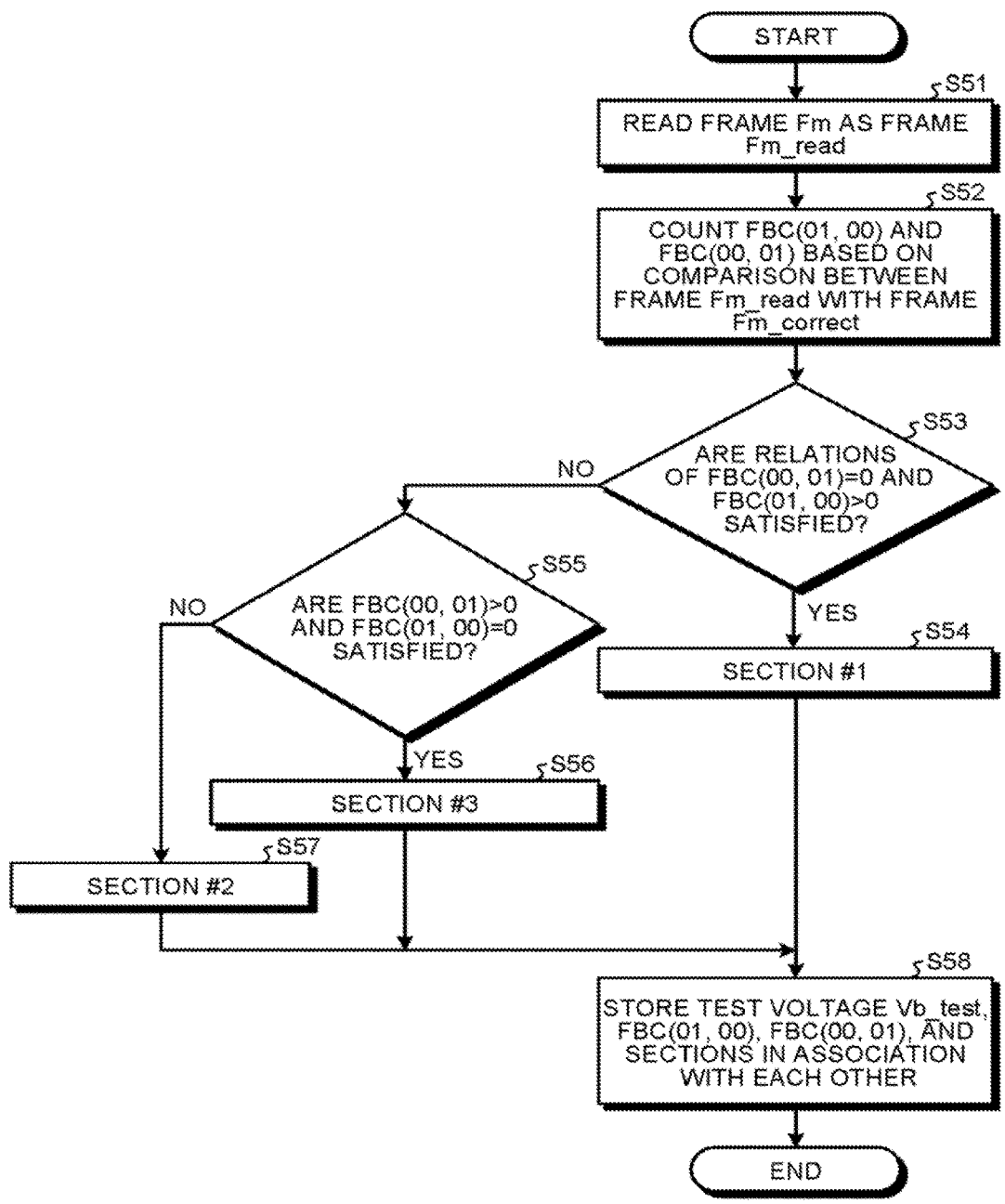
FIG. 11 is a flowchart for describing a test reading of the first embodiment.

FIG. 11 is a flowchart for describing the test-reading of the first embodiment. The NAND controller 23 reads the frame Fm from the memory chip 11 (S51). The frame Fm read in the process of S51 is denoted as the frame Fm_read. The counter 234 counts FBC(01, 00) and FBC(00, 01) by comparing the frame Fm_read and the frame Fm_correct stored in the register 233 (S52).

Herein, the counter 234 counts FBC(01, 00) and FBC(00, 01) based on the comparison between the lower pages. Specifically, the counter 234 counts, as FBC(01, 00), a total number of 1-bit data indicating the code "1" in the frame Fm_correct and the 1-bit data indicating the code "0" in the frame Fm_read. In addition, the counter 234 counts, as FBC(00, 01), a total number of 1-bit data indicating the code "0" in the frame Fm_correct and the 1-bit. data indicating the code "1" in the frame Fm_read. The upper page is not used for counting FBC(01, 00) and FBC(00, 01) due to the following two reasons. The first reason is that an estimation-target read voltage Vb is used in determination on the data belonging to the lower page, but not used in determination on the data belonging to the upper page. The second reason is that a case where the data programmed as the code "11" is read as the code "00" or the code "01", the data programmed as the code "00" is read as the code "11", the data programmed as the code "01" is read as the code "10" or the code "11", or the data programmed as the code "10" is read as the code "01" may be assumed as unusual compared to a case where the data programmed as the code "10" is read as the code "00", or the data programmed as the code "00" is read as the code "01".

The counter 234 reports FBC(01, 00) and FBC(00, 01) to the correction control unit 241. The correction control unit 241 determines one of three sections described below to which a combination of FBC(01, 00) and FBC(00, 01) obtained by the read operation using the test voltage Vb_test belongs.

Figure 12:
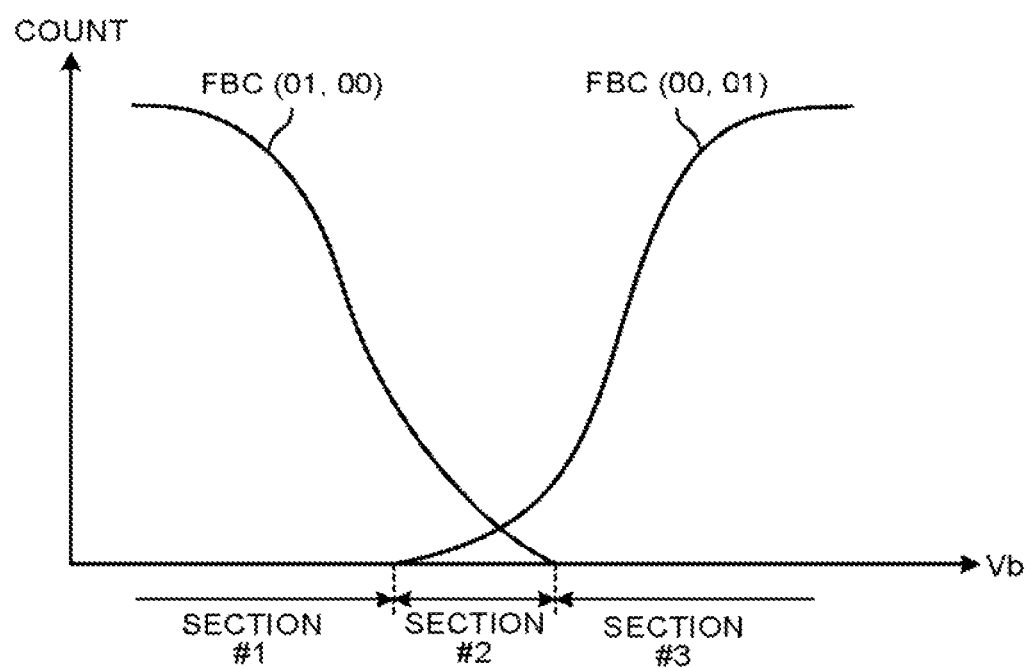
FIG. 12 is a diagram for describing respective sections of the first embodiment.

FIG. 12 is a diagram for describing the respective sections. In the drawing, the horizontal axis indicates the test voltage Vb_test, and the vertical axis indicates the count. A section where FBC(00, 01) is zero and FBC(01, 00) exceeds zero is defined as Section #1. A section where FBC(01, 00) and FBC(00, 01) both exceed zero is defined as Section #2. A section where FBC(01, 00) is zero and FBC(00, 01) exceeds zero is defined as Section #3. Classifying of the combination of FBC(x1y1, x2y2) and FBC(x2y2, x1y1) obtained by the read operation using a test voltage Vi_test into sections may be simply denoted as classifying of the test voltage Vi_test. Further, a case where FBC(00, 01) and FBC(01, 00) both become zero will be described below.

Subsequently to the process of S52, the correction control unit 241 determines whether a relation of FBC(00, 01)=0 and FBC(01, 00)>0 is satisfied (S53). In a case where the relation of FBC(00, 01)=0 and FBC(01, 00)>0 is satisfied (Yes in S53), the correction control unit 241 classifies the test voltage Vb_test into Section #1 (S54). in a case where FBC(00, 01)=0 and FBC(01, 00) >0 is not satisfied (No in S53), the correction control unit 241 determines whether a relation of FBC(00, 01)>0 and FBC(01, 00)=0 is satisfied (S55). In a case where the relation of FBC(00, 01)>0 and FBC(01, 00)=0 is satisfied (Yes in S55), the correction control unit 241 classifies the test voltage Vb_test into Section #3 (S56). In a case where FBC(00, 01)>0 and FBC(01, 00)=0 is not satisfied (No in S55), the correction control unit 241 classifies the test voltage Vb_test into Section #2 (S57).

After the process of S54, the process of S56, or the process of S57, the correction control unit 241 stores the test voltage Vb_test, FBC(01, 00), FBC(00, 01), and the section of the classification result in correspondence with each other (S58), and terminates the test reading.

When the test reading (S32) is terminated, the correction control unit 241 determines whether the test voltage Vb_test is classified into Section #1 (S33). In a case where the test voltage Vb_test is classified into Section #1 (Yes in S33), the correction control unit 241 determines "Vb_default+ V_step" as the test voltage Vb_test for the next test reading, and sets the determined test voltage Vb_test to the memory chip 11 (S34).

"V_step" is an arbitrary positive value, and is set to the correction control unit 241 in advance. For example, "(Vc_default−Vb_default)/2" is employed as V_step. Further, "Vc_default" is a default value of the read voltage Vc.

After the process of S34, the correction control unit 241 performs the test reading again (S35). Thereafter, the correction control unit 241 determines "Vb_default+2*V_step" as the test voltage Vb_test for the next test reading, and sets the determined test voltage Vb_test to the memory chip 11 (S36). Then, the correction control unit 241 performs the test reading (S37).

In a case where the test voltage Vb_test is not classified into Section #1 (No in S33), the correction control unit 241 determines whether the test voltage Vb_test is classified into Section #3 (S38). In a case where the test voltage Vb_test is classified into Section #3 (Yes in S38), the correction control unit 241 determines "Vb_default−V_step" as the test voltage Vb_test for the next test reading, and sets the determined test voltage Vb_test to the memory chip 11 (S39). Then, the correction control unit 241 performs the test reading (S40). Thereafter, the correction control unit 241 determines "Vb_default−2*V_step" as the test voltage Vb_test for the next test reading, and sets the determined test voltage Vb_test to the memory chip 11 (S41). Then, the correction control unit 241 performs the test reading (S42).

In a case where the test voltage Vb_test is classified into Section #3 (No in S38), the correction control unit 241 determines "Vb_default+V_step" as the test voltage Vb_test for the next test reading, and sets the determined test voltage Vb_test to the memory chip 11 (S43). Then, the correction control unit 241 performs the process of S40.

In this way, in a case where the classification result of Section #1 is obtained in the test reading of the first time, the correction control unit 241 sets the test voltage Vb_test used in the following two test readings from an area located in the positive direction on the basis of the voltage Vb_default used in the first test reading. In addition, in a case where the classification result of Section #3 in the test reading of the first time is obtained, the correction control unit 241 sets the test voltage Vb_test used in the following two test readings from an area located in the negative direction on the basis of the voltage Vb_default used in the test reading of the first time. A read voltage Vb_min with which the error number can be minimized is assumed to be present in Section #2. When it is determined that the test voltage Vb_test used in the test reading of the first time belongs to Section #1 or Section #3, the correction control unit 241 can set the test voltage Vb_test for the test reading to be performed later to be closer to the read voltage Vb_min than the test voltage Vb_test used in the test reading of the first time.

After the process of S37 or the process of S42, the correction control unit 241 determines whether the classification result of Section #1 and the classification result of Section #3 each are obtained at least once (S44). In a case where the classification result of Section #1 and the classification result of Section if each are obtained at least once (Yes in S44), a relation of "FBC(01, 00)+FBC(00, 01)" and the test voltage Vb_test is fitted to a predetermined function (for example, a quadric function or the like) (S45). The correction control unit 241 calculates a voltage at which "FBC(01, 00)+FBC(00, 01)" in the fitted function is minimized as an estimation value Vb_calc of the read voltage Vb (S46), and terminates the voltage estimation process.

In a case where the classification result of Section #1 or the classification result of Section #3 is not obtained even once (No in S44), the correct ion control unit 241 determines a voltage at which "FBC(01, 00)+FBC(00, 01)" is minimized among the stored test voltages Vb_test as the estimation value Vb_calc of the read voltage Vb (S47), and terminates the voltage estimation process.

After the voltage estimation process (S18), the correction control unit 241 sets the estimation value Vb_calc of the read voltage Vb to the memory chip 11 (S19). The correction control unit 241 reads the n frames Ft from the memory chip 11 by controlling the NAND controller 23 (820). In the NAND controller 23, the randomization unit 232 performs the reverse process on the n read frames Ft (S21). Further, in a case where there is the frame Ft already succeeding in the error correction, among the n frames Ft, the subsequent processes of S21 may foe not performed on the frame Ft succeeding in the error correction. The first ECC unit 231 performs the error correction on the n frames Ft subjected to the reverse process (S22). The result of the error correction is reported to the correction control unit 241.

The correction control unit 241 determines whether there is the frame Ft failed in the error correction (S23). In a case where there is no frame Ft failed in the error correction (No in S23), the n frames Ft are transmitted to the RAM 22, and the operation is terminated.

In a case where there is the frame Ft failed in the error correction (Yes in S23), the correction control unit 241 causes the second ECC unit 25 to correct the frame Ft failed, in the error correction (324). Then, the correction control unit 241 determines whether there is the frame Ft failed in the error correction (S24). In a case where there is no frame Ft failed in the error correction (No in 825), the n frames Ft are transmitted to the RAM 22, and the operation is terminated. In a case where there is the frame Ft failed in the error correction (Yes in S25), the correction control unit 241 performs an uncorrectable error process (S26). The uncorrectable error process is a process performed in a case where the data is not possible to be recovered. For example, the uncorrectable error process is a process of transmitting a message of the fact about that the data is not possible to be read toward the host apparatus 200.

In addition, in a case where it is determined that there is no frame succeeding in the error correction in the determination process of S12 (NO in S12) or in a case where it is determined that there is no frame succeeding in the error correction in the determination process of S14 (No in S14), the correction control unit 241 performs the process of S26.

Figure 13A:
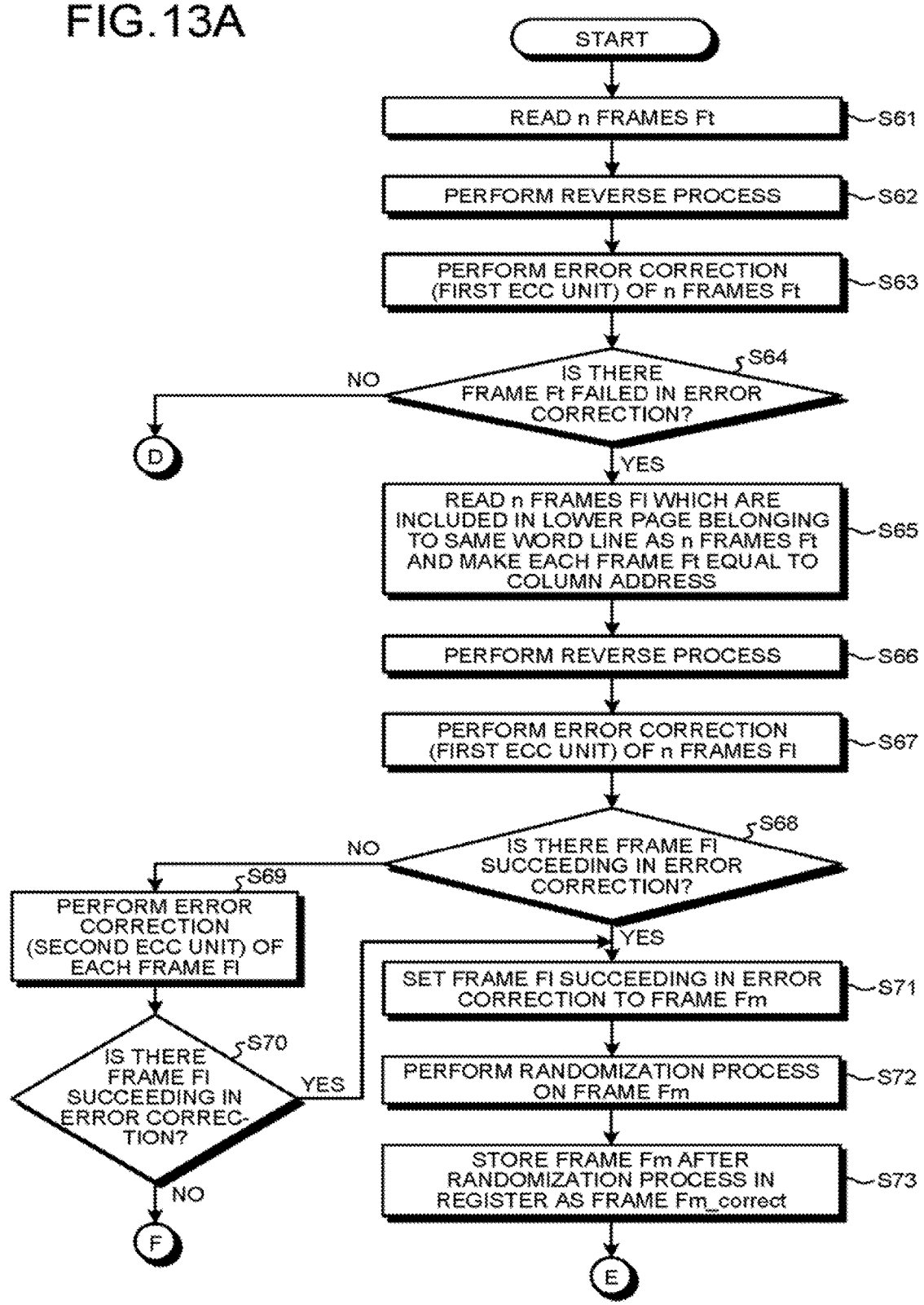
FIG. 13A is a flowchart for describing an operation of the memory system at the time of "read" of an upper page.
Figure 13B:
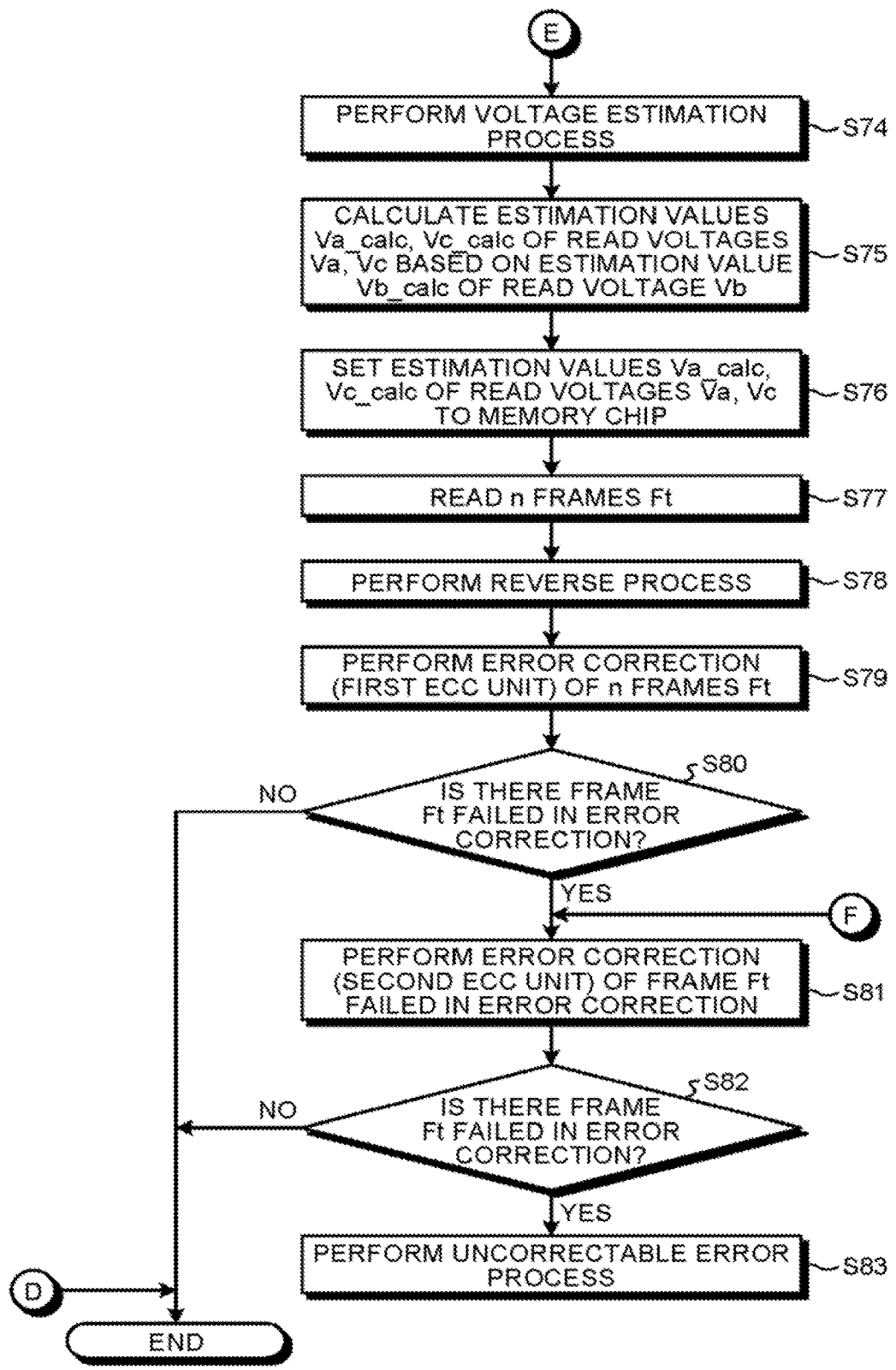
FIG. 13B is a flowchart for describing an operation of the memory system at the time of "read" of the upper page.

FIGS. 13A and 13B are flowcharts for describing the operation of the memory system 100 when the upper page is read. First, the NAND controller 23 reads the frame Ft of the read target from the memory chip 11 (S61). The randomization unit 232 performs the reverse process on the n read frames Ft (S62). The first ECC unit 231 performs the error correction on the n frames Ft subjected to the reverse process (S63). The result of the error correction is reported to the correction control unit 241.

The correction control unit 241 determines whether there is the frame Ft failed in the error correction (S64). In a case where there is no frame Ft failed in the error correction (No in S64), the n frames Ft are transmitted to the RAM 22, and the operation is terminated.

In a case where there is the frame Ft failed in the error correction (Yes in S64), the correction control unit 241 reads n frames Fl which are included in the lower page belonging to the same word line as the n frames Ft and each of which the column address is same as the column address of each frame Ft from the memory chip 11 (S65). The n frames Ft and the n frames Fl have a relation same as a relation of a 2-value data group belonging to the upper page in a 4-value data group stored in the same memory cell group and a 2-value data group belonging to the lower page. The randomization unit 232 performs the reverse process on the n read frames Fl (S66). The first ECC unit 231 performs the error correction on the n frames Fl subjected to the reverse process (S67). The result of the error correction is reported to the correction control unit 241.

The correction control unit 241 determines whether there is the frame Fl succeeding in the error correction (S68). In a case where there is no frame Fl succeeding in the error correction (No in S68), the correction control unit 241 causes the second ECC unit 25 to sequentially perform the error correction of the n frames Fl until a frame succeeding in the error correction is obtained (S69). Then, the correction control unit 241 further determines whether there is the frame Fl succeeding in the error correction (S70). In a case where there is no frame Fl succeeding in the error correction (No in S70), the correction control unit 241 proceeds to the process of S81 to be described below, and causes the second ECC unit 25 to perform the error correction on the n frames Ft.

In a case where there is the frame Fl succeeding in the error correction of the first ECC unit 231 (Yes in S68), or in a case where there is the frame Fl succeeding in the error correction of the second ECC unit 25 (Yes in S70), the correction control unit 241 sets the frame Ft succeeding in the error correction to the frame Fm (S71). The randomization unit 232 performs the randomization process on the frame Fm (S72). The NAND controller 23 stores the frame Fm subjected to the randomization process in the register 233 (S73). The frame Fm recovered and then subjected to the randomization process is denoted as the frame Fm_correct.

Subsequently, the correction control unit 241 calculates the estimation value Vb_calc of the read voltage Vb by performing the same voltage estimation process as the process of S18 (S74). Then, the correction control unit 241 calculates an estimation value Va_calc of the read voltage Va and an estimation value Vc_calc of the read voltage Vc based on the estimation value Vb_calc of the read voltage Vb (S75).

A calculation algorithm for calculating Va_calc and Vc_calc from Vb_calc is set to the correction control unit 241 in advance. For example, a function (including a table) defining a relation among the read voltage Va, the read voltage Vb, and the read voltage Vc is set to the correction control unit 241 in advance. For example, the correction control unit 241 calculates a deviation amount by subtracting Vb_default from Vb_calc. The correction control unit 241 adds the calculated deviation amount to Va_default to calculate Va_calc. Further, Va_default is a default value of the read voltage Va. In addition, the correction control unit 241 adds the calculated deviation amount to Vc_default to calculate Vc_calc.

After the process of S75, the correction control unit 241 sets the estimation value Va_calc of the read voltage Va and the estimation value Vc_calc of the read voltage Vc to the memory chip 11 (S76). The correction control unit 241 reads the n frames Ft from the memory chip 11 according to the control of the NAND controller 23 (S77). Thereafter, in S78 to S83, the similar processes as S21 to S26 are performed.

In this way, according to the first embodiment, the memory controller 2 individually counts FBC(01, 00) and FBC(00, 01) by comparing the frame Fm_correct at the time of programming with the frame Fm_read read out of the memory chip 11. Then, the memory controller 2 changes the read voltage Vb based on the counted FBC(01, 00) and FBC(00, 01). Specifically, the memory controller 2 calculates the test voltage Vb_test based on a combination of FBC(01, 00) and FBC(00, 01). Then, the memory controller 2 performs the test reading using the test voltage Vb_test, and estimates the read voltage Vb_min which can make the error number (that is, a sum value of FBC(01, 00) and FBC(00, 01)) minimized based on the result of the test reading. Herein, when the test voltage Vb_test is set in the vicinity of the read voltage Vb_min, an error between the obtained estimation value Vb_calc and the read voltage Vb_min can be reduced. Based on FBC(01, 00) and FBC(00, 01), the memory controller 2 can set the test voltage Vb_test from the area containing the read voltage Vb_min in the area of the positive direction and the area of the negative direction on the basis of a read voltage Vb_default. Therefore, according to the first embodiment, it is possible to efficiently calculate the estimation value Vb_calc of the read voltage Vb_min compared to a case where the test voltage Vb_test is set at random to calculate the estimation value Vb_calc of the read voltage Vb_min. Further, the description herein has been made about a case where the default value Vb_default is used as the test voltage Vb_test of the test reading at the first time, but the test voltage Vb_test used in the test reading at the first time may be not the default value Vb_default. In addition, the correction control unit 241 may determine a section at each test reading and determine the test voltage Vb_test for the next test reading based on the determination result.

In addition, since the memory controller 2 uses the error correction to recover the frame Fm_correct at the time of programming, a known data pattern is not necessary to be prepared only for the estimation of the read voltage Vb. In other words, the memory controller 2 can estimate the read voltage Vb using arbitrary user data. Further, the user data is data which is written from the host apparatus 200 and then programmed in the memory chip 11.

In addition, the memory controller 2 determines one of Section #1 to Section #3 to which the combination of FBC(01, 00) and FBC(00, 01) belongs. Section #1 is a section in which FBC(01, 00) exceeds a predetermined number (a first value) and FBC(00, 01) does not exceed the first value. Further, the description herein is made in a case where zero is set as the first value, but a value other than zero may be employed as the first value. Section #3 is a section in which FBC(01, 00) does not exceed the first value and FBC(00, 01) exceeds the first value. In a case where the combination of FBC(01, 00) and FBC(00, 01) belongs to Section #1, the memory controller 2 sets the test voltage Vb_test from the area of the positive direction on the basis of the read voltage Vb_default used for obtaining the combination. In a case where the combination of FBC(01, 00) and FBC(00, 01) belongs to Section #3, the memory controller 2 sets the test voltage Vb_test from the area of the negative direction on the basis of the read voltage Vb_default used for obtaining the combination.

Further, both FBC(01, 00) and FBC(00, 01) exceed the first value (zero in FIG. 12) in Section #2 described in FIG. 12. In this regard, for example, in a case where the skirt of Distribution A and the skirt of Distribution B are not overlapped, a section between Distribution A and Distribution B is present such that both FBC(01, 00) and FBC(00, 01) do not exceed the first value. The memory controller 2 considers the section in which both FBC(01, 00) and FBC(00, 01) do not exceed the first value as Section #2. In other words, the memory controller 2 handles a section which does not belong to any one of Section #1 and Section #3 as Section #2.

In addition, the memory controller 2 performs the test reading plural times while changing the test voltage Vb_test. The memory controller 2 estimates the read voltage Vb which makes the error number minimized based on the error number obtained at each test reading. Therefore, the memory controller 2 can shift the read voltage Vb to make the error number as small as possible. As described above, there is an upper limit value in the error number correctable by the respective ECC units (the first ECC unit 231 and the second ECC unit 25). Since the read voltage Vb can be set to make the error number as small as possible, it is possible to suppress an event that the data is not recovered even when the error correction is attempted.

In addition, in the above example, the memory controller 2 estimates the read voltage Vb_min by fitting a relation of the test voltage Vb_test and the error number to a predetermined function during the voltage estimation process. The quadric function can be used for the fitting. In addition, in the above description, the memory controller 2 calculates the estimation value Vb_calc of the read voltage Vb_min based on the result of three test readings, but the memory controller 2 may be configured to perform the test reading four times or more.

For example, in a case where the classification result of Section #1 is not obtained, the memory controller 2 may repeatedly perform the test reading while sequentially changing the test voltage Vb_test in the negative direction until the classification result of Section #1 is obtained. In addition, in a case where the classification result of Section #3 is not obtained, the memory controller 2 may repeatedly perform the test reading while sequentially changing the test voltage Vb_test in the positive direction until the classification result of Section #3 is obtained.

Figure 14:
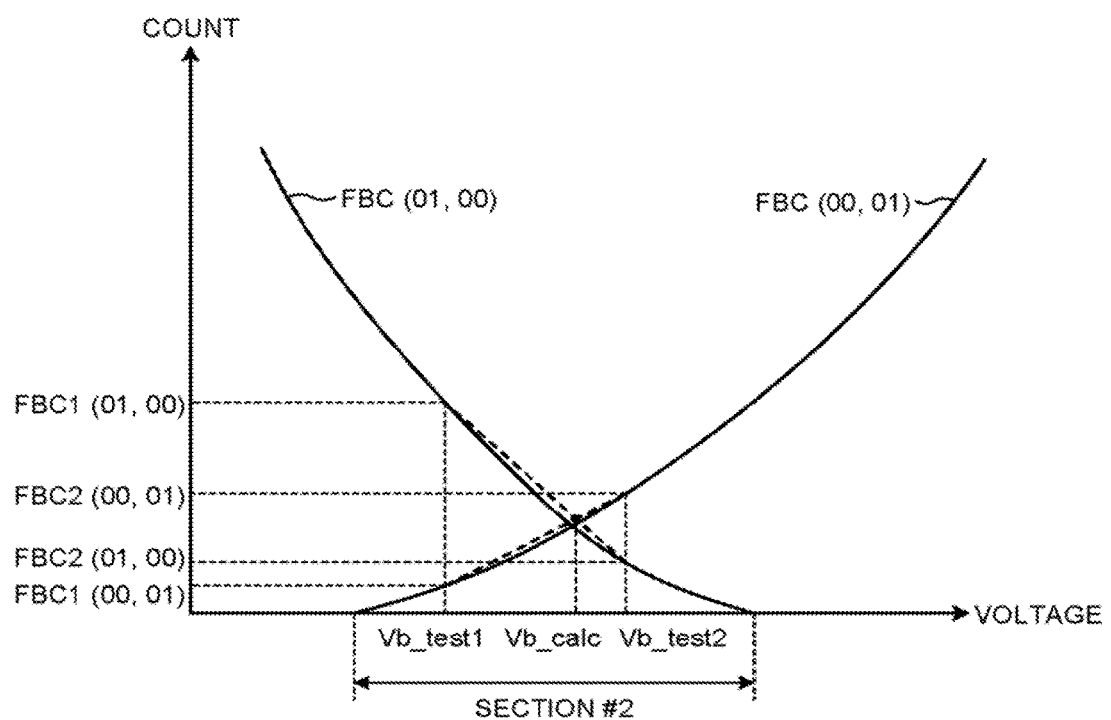
FIG. 14 is a diagram for describing another example of a method of calculating an estimation value of the threshold voltage.

For example, the memory controller 2 may calculate the estimation value of the read voltage Vb based on the result of two test readings. FIG. 14 is a diagram for describing another example of the method of calculating the estimation value of the read voltage Vb. A case where the memory controller 2 performs the test reading two times and the combination of FBC(01, 00) and FBC(00, 01) is classified into Section #2 in both the test readings will be considered. As illustrated in FIG. 14, tine memory controller 2 calculates a voltage at the intersection between a straight line connecting coordinates (Vb_test1, FBC1 (01, 00)) and coordinates (Vb_test2, FBC2(01, 00)) and a straight line connecting coordinates (Vb_test1, FBC1(00, 01)) and coordinates (Vb_test2, FBC2 (00, 01)) as the estimation value Vb_calc. Further, "Vb_test1" is the test voltage which is set in one of the two test readings, and "Vb_test2" is the test voltage which is set in the other one of the two test readings. In addition, FBC1 is a value counted in the one of the two test readings, and FBC2 is a value counted in the other one of the two test readings.

In addition, the memory controller 2 stores a relation of the read voltage Vb and the read voltages Va and Vc in advance, and the read voltages Va and Vc are estimated based on the estimation value Vb_calc of the read voltage Vb and the pre-stored relation. Therefore, the memory controller 2 can make the reading of the upper page unnecessary in the test reading.

In addition, in a case where a target frame Ft of the read target is failed in the error correction, the memory controller 2 can select another frame Fs belonging to the same page as the frame Ft as the target frame Fm of the test reading. Therefore, a large number of frames usable as the target frame Fm of the test reading are secured.

Further, the memory controller 2 calculates the estimation value Vb_calc of the read voltage Vb (obtained only by using the lower page in the first embodiment) with the use of the determination on whether the; data belonging to the lower, page is "0" or "1" only by using the read voltage Vb. In a case where a system of storing three or more bits in each memory cell is applied, and a case where there(r) is a certain page which is configured to determine whether the code is "0" or "1" among the plurality of pages forming one word line according to a magnitude of the threshold voltage with respect to a single read voltage, the memory controller 2 can calculate the estimation value of the read voltage only by using the certain page.

Second Embodiment

In a second embodiment, a method of estimating the threshold voltage using all the pages belonging to the same word line will be described. Herein, a case where the 2-bit storing method is applied will be described.

The correction control unit 241 searches a pair of the upper page and the lower page (a target of the test reading) among pairs of the upper page and the lower page, each of which belongs to the same word line and has the same column address. Then, the counter 234 counts FBC based on the 4-value data configured by bits belonging to the upper page and bits belonging to the lower page. The target pair of the test reading may contain the frame Ft of the read target, or may be not contain the frame Ft of the read target.

Herein, a frame Fsu belonging to the upper page and a frame Fsl belonging to the lower page are assumed to be searched as the target pair of the test reading by the correction control unit 241. The frame Fsu which is recovered to a state at the time of the programming and subjected to the randomization process after the recovery is denoted as a frame Fsu_correct. The frame Fsl which is recovered to a state at the time of the programming and subjected to the randomization process after the recovery is denoted as a frame Fsl_correct. The frame Fsu_correct and the frame Fsl_correct are assumed to be calculated and stored in the register 233 already.

Figure 15:
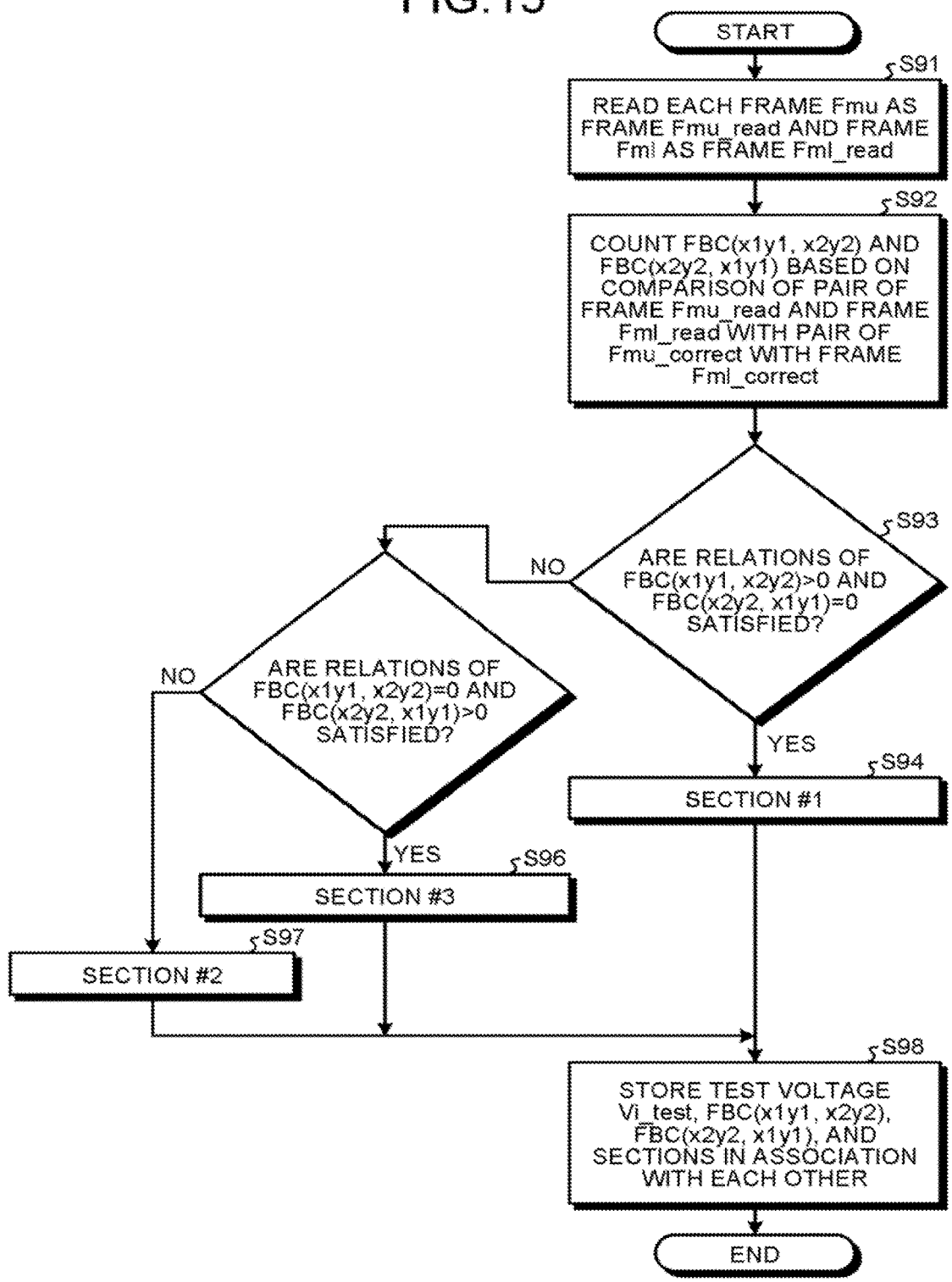
FIG. 15 is a flowchart for describing a test reading of a second embodiment.

FIG. 15 is a flowchart for describing the test reading of the second embodiment. The NAND controller 23 reads the frame Fmu and the frame Fml from the memory chip 11 (S91). The frame Fmu read by the process of S91 is denoted as the frame Fmu_read, and the frame Fml read by the process of S91 is denoted as the frame Fml_read. The counter 234 counts FBC(x1y1, x2y2) and FBC(x2y2, x1y1) by comparing the frame Fmu_read and the frame Fml_read and the frame Fmu_correct and the frame Fml_correct stored in the register 233 (S92). The counter 234 reports FBC(x1y1, x2y2) and FBC(x2y2, x1y1) to the correction control unit 241.

For example, the counter 234 generates a string of the 4-value data using the frame Fmu_read and the frame Fml_read. The counter 234 generates a string of the 4-value data using the frame Fmu_correct and the frame Fml_correct. The counter 234 outputs, as FBC(x1y1, x2y2), a total number of data in which the 4-value data generated from a pair of the frame Fmu_correct and the frame Fml_correct is "x1y1" and the 4-value data generated from a pair of the frame Fmu_read and the frame Fml_read is "x2y2". In addition, the counter 234 outputs, as FBC(x2y2, x1y1), a total number of data in which the 4-value data generated from the pair of the frame Fmu_correct and the frame Fml_correct is "x2y2" and the 4-value data generated from the pair of the frame Fmu_read and the frame Fml_read is "x1y1".

Subsequently to the process of S92, the correction control unit 241 determines one or Section #1 to Section #3 to which the test voltage Vi_test belongs. Specifically, the correction control unit 241 first determines whether the relations of FBC(x1y1, x2y2)>0 and FBC(x2y2, x1y1)=0 are satisfied (S93). In a case where the relations of the FBC(x1y1, x2y2)>0 and FBC(x2y2, x1y1)=0 are satisfied (Yes in S93), the correction control unit 241 classifies the test voltage Vi_test into Section #1 (S94). In a case where the relations of FBC(x1y1, x2y2)>0 and FBC(x2y2, x1y1)=0 are not satisfied (No in S93), the correction control unit 241 determines whether the relations of FBC(x1y1, x2y2)=0 and FBC(x2y2, x1y1)>0 are satisfied (S95). In a case where the relations of FBC(x1y1, x2y2)=0 and FBC(x2y2, x1y1)>0 are satisfied (Yes in S95), the correction control unit 241 classifies the test voltage Vi_test into Section #3 (S96). In a case where the relations of FBC(x1y1, x2y2)=0 and FBC (x2y2, x1y1)>0 are not satisfied (No in S95), the correction control unit 241 classifies the test voltage Vi_test into Section #2 (S97).

After the process of S94, the process of S96, or the process of S97, the correction control unit 241 stores the test voltage Vi_test, FBC(x1y1, x2y2), FBC(x2y2, x1y1), and the determined sections in correspondence with each other (S98), and terminates the test reading.

Similarly to the first embodiment, the correction control unit 241 determines the test voltage Vi_test for the next test reading using the classification result of the test reading. In addition, the correction control unit 241 performs the test reading plural times, estimates a voltage that makes FBC (x1y1, x2y2)+FBC(x2y2, x1y1) minimized, and determines the estimated voltage as a setting value of the read voltage Vi.

In the second embodiment, the memory controller 2 counts FBC using all the pages belonging to the same word line. In the first embodiment, the estimation value Va_calc of the read voltage Va and the estimation value Vc_calc of the read voltage Vc are calculated using the estimation value Vb_calc of the read voltage Vb. In this regard, according to the second embodiment, the estimation value Va_calc of the read voltage Va and the estimation value Vc_calc of the read voltage Vc can be directly calculated. Further, in the second embodiment, all the pages belonging to the same word line are used. Therefore, the second embodiment is applicable even in a case where there is employed a memory system in which each memory cell stores a value of 3 bits or more.

Third Embodiment

In a third embodiment, the correction control unit 241 may increase V_step as a difference value from Section #2 of the test voltage Vi_test becomes larger. The correction control unit 241 determines the difference value from Section #2 of the test voltage Vi_test according to the value of FBC. In other words, the correction control unit 241 increases V_step as the value of FBC becomes larger.

Figure 16:
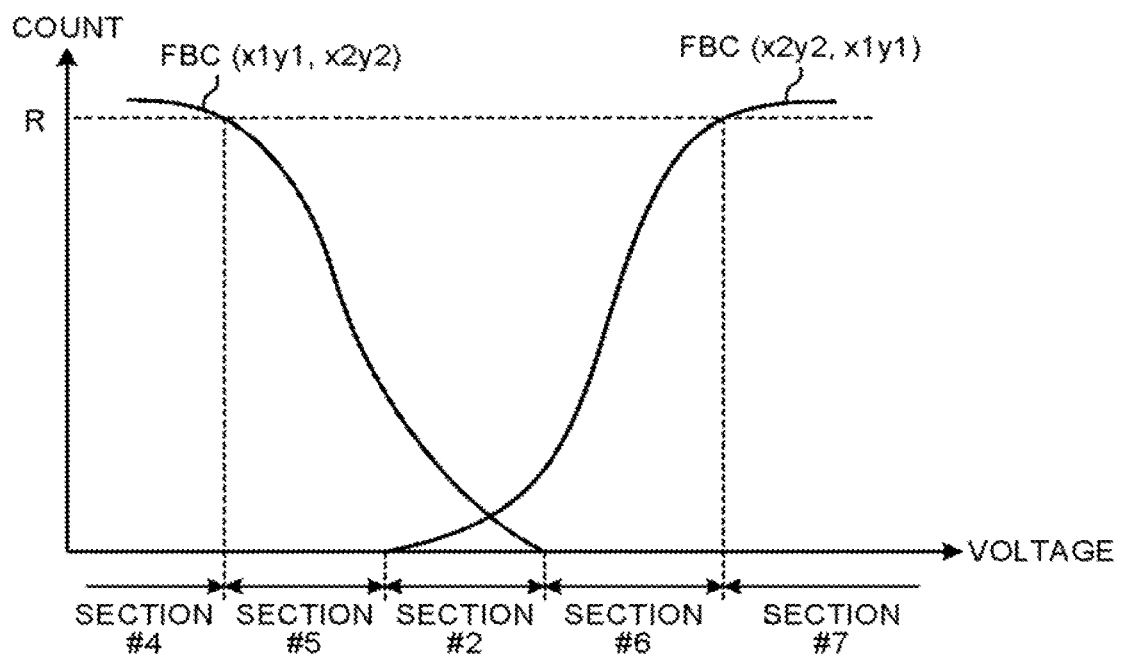
FIG. 16 is a diagram for describing sections of a third embodiment.

FIG. 16 is a diagram for describing the respective sections of the third embodiment. In the third embodiment, Section #1 is divided into Section #4 and Section #5 according to whether FBC(x1y1, x2y2) is larger or smaller than a determination threshold R (a second value). In addition, Section #3 is divided into Section #6 and Section #7 according to whether FBC(x2y2, x1y1) is larger or smaller than the determination threshold R. Specifically, a section where FBC(x2y2, x1y1) is zero and FBC(x1y1, x2y2) exceeds the determination threshold R is defined as Sections #4. A section where FBC(x2y2, x1y1) is zero, FBC(x1y1, x2y2) does not exceed the determination threshold R, and FBC (x1y1, x2y2) exceeds zero is defined as Section #5. A section where FBC(x1y1, x2y2) is zero, FBC(x2y2, x1y1) exceeds zero, and FBC(x2y2, x1y1) does not exceed the determination threshold R is defined as Section #6. A section where FBC(x1y1, x2y2) is zero and FBC(x2y2, x1y1) exceeds the determination threshold R is defined as Section #7. Further, the determination threshold R for distinguishing Section #4 from Section #5 and the determination threshold R for distinguishing Section #6 from Section #7 may be different.

In a case where the combination of FBC(x1y1, x2y2) and FBC(x2y2, x1y1) is classified into Section #4 or Section #7, the correction control unit 241 has a value of V_step larger than a case where the combination of FBC(x1y1, x2y2) and FBC(x2y2, x1y1) is classified into Section #5 or Section #6.

Further, the description has been made about a case where Section #1 and Section #3 each are divided into two sections, but each section may be divided into three or more sections. In addition, the number of divisions of Section #1 and the number of divisions of Section #3 may be different each other.

In this way, the correction control unit 241 increases V_step as the value of FBC becomes larger. Therefore, since the test voltage Vi_test can be efficiently set in the vicinity of Section #2, it is possible to efficiently calculate the estimation value Vi_calc of the read voltage Vi.

Fourth Embodiment

FIG. 17 is a diagram illustrating an example of mounting the memory system 100. The memory system 100, for example, is mounted in a server system 1000. The server system 1000 is configured such that a rack mount server 400 and a disk array 500 are connected by a communication interface 600. As a standard of the communication interface 600, any standard can be employed. The rack mount server 400 is configured such that one or more host apparatuses 200 are mounted in the server rack. Each host apparatus 200 mounted in the server rack can make access to the disk array 500 through the communication interface 600.

The disk array 500 is configured such that one or more memory systems 100 and one or more hard disk units 700 are mounted in the server rack. Each memory system 100 can output the data according to a read request from each host apparatus 200. In addition, each memory system 100 has a configuration in which the first to third embodiments are employed. Therefore, each memory system 100 can suppress an event causing the uncorrectable error process.

Further, in the disk array 500, for example, one or more memory systems 100 may be used a cache memory of one or more hard disk units 700. The disk array 500 may be mounted with a storage controller unit establishing RAID using one or more hard disk units 700.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a semiconductor memory configured to include a memory cell array which includes a plurality of word lines, the word line including a plurality of memory cells, the memory cell holding charges, and a peripheral circuit comparing an amount of charges with a first charge threshold to determine a code according to the amount of charges for the memory cell; and
   a memory controller configured to read a first data group from the semiconductor memory, perform error correction on the read first data group, calculate a second charge threshold based on a second data group stored in a same word line as the first data group in a case where the error correction is failed, and set the calculated second charge threshold to the peripheral circuit.

2. The memory system according to claim 1,
   wherein the memory controller reads the second data group from the semiconductor memory, counts a number of first data and a number of second data based on a comparison of a third data group with a fourth data group, and calculates the second charge threshold based on the number of first data and the number of second data, and the third data group is the second data group at the time of writing to the semiconductor memory, the fourth data group is the second data group read out of the semiconductor memory, the first data is data changed from a first code to a second code, and the second data is data changed from the second code to the first coded.

3. The memory system according to claim 2, wherein the memory controller reads the second data group from the semiconductor memory and performs the error correction on the real second data group to recover the third data group.

4. The memory system according to claim 2, wherein the memory controller calculates a third charge threshold based on a combination of the number of first data and the number of second data, sets the third charge threshold to the peripheral circuit to perform a test reading, and calculates the second charge threshold based on a result of the test reading.

5. The memory system according to claim 4,
wherein an amount of charges smaller than the first charge threshold corresponds to the first code, and an amount of charges larger than the first charge threshold corresponds to the second code, and the memory controller classifies the combination of the number of first data and the number of second data counted based on the comparison of the third data group with the fourth data group into one of a first section, a second section, and a third section, sets a value larger than a fourth charge threshold to the third charge threshold in a case where the combination is classified into the first section, and sets a value smaller than the fourth charge threshold to the third charge threshold in a case where the combination is classified into the third section, the first section being a section in which the number of first data exceeds a count threshold and the number of second data does not exceed the count threshold, the third section being a section in which the number of first data does not exceed the count threshold and the number of second data exceeds the count threshold, the second section being a section which belongs to neither the first section nor the third section, and the fourth charge threshold being a threshold used by the peripheral circuit to obtain the combination.

6. The memory system according to claim 5,
wherein the test reading is a process of counting a number of first data and a number of second data included in a fifth data group based on the comparison of the third data group with the fifth data group, and the fifth data group is the second data group read from the semiconductor memory using the third charge threshold.

7. The memory system according to claim 6,
wherein the third charge threshold includes a plurality of fifth charge thresholds which is different from each other, and the memory controller performs the test reading for the fifth charge threshold, estimates a threshold at which a sum value of the number of first data and the number of second data becomes minimum based on the number of first data and the number of second data counted for the test reading, and determines the estimated value as the second charge threshold.

8. The memory system according to claim 5,
wherein the memory controller increases a difference between the fourth charge threshold and the third charge threshold as the number of first data or the number of second data becomes larger.

9. The memory system according to claim 1,
wherein the peripheral circuit determines one of three or more codes including the first code and the second code which corresponds to the amount of charges by comparing the amount of charges with each of the first charge threshold and a sixth charge threshold, and the memory controller stores a function of defining a relation between the first charge threshold and the sixth charge threshold in advance, calculates the second charge threshold, and then changes the sixth charge threshold based on the second charge threshold and the function.

10. The memory system according to claim 1,
wherein the memory controller selects the read first group in a case where the error correction is succeeded.

* * * * *